(12) United States Patent
Fukui et al.

(10) Patent No.: US 7,126,872 B2
(45) Date of Patent: Oct. 24, 2006

(54) SEMICONDUCTOR INTEGRATED CIRCUIT

(75) Inventors: Kenichi Fukui, Kodaira (JP); Mitsuru Hiraki, Kodaira (JP); Mitsuhiko Okutsu, Mito (JP)

(73) Assignee: Renesas Technology Corp., Tokyo (JP)

( * ) Notice: Subject to any disclaimer, the term of this patent is extended or adjusted under 35 U.S.C. 154(b) by 182 days.

(21) Appl. No.: 10/961,134

(22) Filed: Oct. 12, 2004

(65) Prior Publication Data
US 2005/0083736 A1    Apr. 21, 2005

(30) Foreign Application Priority Data
Oct. 17, 2003  (JP)  ............................. 2003-358539

(51) Int. Cl.
*G11C 5/14* (2006.01)
*G11C 16/04* (2006.01)
(52) U.S. Cl. ............. 365/226; 365/189.09; 365/185.18
(58) Field of Classification Search ................ 365/226, 365/189.09, 185.18
See application file for complete search history.

(56) References Cited
U.S. PATENT DOCUMENTS
5,652,730 A * 7/1997 Kono et al. ................. 365/226

5,920,185 A    7/1999 Ozoe

FOREIGN PATENT DOCUMENTS
JP    10-214121    8/1998
JP    2001-358575    12/2001

* cited by examiner

*Primary Examiner*—Huan Hoang
(74) *Attorney, Agent, or Firm*—Miles & Stockbridge P.C.

(57) ABSTRACT

In view of controlling overshoot when the power supply is inputted without increase in the area occupied with a chip in a voltage generating circuit mounted over a semiconductor integrated circuit, an internal voltage generating circuit comprises a voltage generating circuit for generating a second voltage from a first voltage supplied from outside, and an output buffer for generating a third voltage corresponding to the second voltage. The third voltage is used as the operation power supply of the internal circuit. Moreover, a first switch for enabling an output node of the second voltage to become conductive to the predetermined potential and a control circuit for turning ON the first switch for the predetermined period in response to input of the first voltage are also provided. An output terminal of the output buffer is not clamped but an output of the voltage generating circuit in the preceding stage is clamped to the predetermined voltage. The transistor of the first switch for clamping the voltage may be remarkably reduced in size in comparison with an output transistor of the output buffer. Accordingly, the area occupied by the chip is not enlarged.

12 Claims, 20 Drawing Sheets

SEMICONDUCTOR INTEGRATED CIRCUIT

CROSS-REFERENCE TO RELATED APPLICATION

The present application claims priority from Japanese patent application No. 2003-358539 filed on Oct. 17, 2003, the content of which is hereby incorporated by reference into this application.

BACKGROUND OF THE INVENTION

The present invention relates to an overshoot control technology at turning ON the power supply of a constant voltage generating circuit, and for example, the present invention relates to a technology which can be effectively adapted to a microcomputer or the like in which a step-down voltage generating circuit for generating an internal voltage is loaded.

As a technology for controlling overshoot in a constant voltage generating circuit when the power supply voltage thereof is turned ON, a clamping transistor is provided to realize clamping, by making an output terminal of an output buffer conductive to the ground voltage only for the predetermined period when the power supply is turned ON, to a constant voltage circuit, for example, comprising a differential amplifying circuit to receive the standard voltage as the reference potential and an output buffer (output stage circuit) which is connected, through negative feedback, to the differential amplifying circuit for conducting the current output operation. Overshoot of the relevant output terminal which is generated when the power supply is turned ON can be controlled using such clamping transistor (FIG. 1 in the Patent Document 1). In addition, the overshoot can be controlled through quick defining of the operating condition by improving operation rate of the differential amplifying circuit when the power supply is turned ON (FIG. 2 in the Patent Document 1) and through cut-off of a current supplying transistor circuit of the output buffer (FIG. 5 in the Patent Document 1). The Patent Document 2 can also be listed additionally as the technology for preventing overshoot by providing a clamping transistor to an output of the output buffer of a low voltage generating circuit.

[Patent Document 1]
Japanese Unexamined Patent Publication No. Hei 10(1998)-214121.

[Patent Document 2]
Japanese Unexamined Patent Publication No. 2001-358575 (FIG. 2).

SUMMARY OF THE INVENTION

The inventors of the present invention have investigated control of overshoot in a constant voltage generating circuit when the power supply voltage is turned ON. Such overshoot is generated when an output of each circuit rises by receiving an input from the preceding stage at turning ON of the power supply voltage, because rise of an output is influenced by the rise of power supply due to capacitive coupling between an output of each circuit and the power supply voltage. The capacitive coupling is formed, for example, by parasitic capacitance between source and drain of an output transistor. An output buffer must have a large current supplying capability because it has the function to supply the operation power sources of internal circuits. Namely, a very large size output transistor is employed. Accordingly, the clamping transistor must be formed of a large size transistor corresponding thereto. The reason is that the clamping transistor is required to have large current driving capability which is equivalent to that of the output buffer. In this viewpoint, the inventors of the present invention have found a problem that the clamping transistor provided in the output stage of output buffer also become very large in size like an output transistor and thereby the area occupied by such clamping transistor becomes very large. In addition, provision in the output stage of output buffer of the clamping transistor for preventing overshoot goes against realization of low power consumption because the output buffer and clamping transistor having the large current driving capability are simultaneously turned ON to pull the power source current with each other, whereby a large through-current is generated. Moreover, the inventors of the present invention have also found that when a small operation current is assigned to a pre-buffer in the preceding stage from the view point of low power consumption, a longer period is required for stabilization of an output voltage after the control of overshoot.

An object of the present invention is to control or alleviate overshoot generated when the power supply voltage is turned ON without increase in chip occupation area in a voltage generating circuit mounted in a semiconductor integrated circuit.

Another object of the present invention is to control or alleviate overshoot generated when the power supply voltage is turned ON without increase in through-current in the voltage generating circuit mounted in the semiconductor integrated circuit.

Still another object of the present invention is to control or alleviate overshoot generated when the power supply voltage is turned ON not requiring a longer time for stabilization of an output voltage after the power supply voltage is turned ON in the voltage generating circuit mounted in the semiconductor integrated circuit.

The aforementioned and the other objects and novel features of the present invention will become apparent from the description in the present specification and the accompanying drawings thereof.

The typical inventions among the invention disclosed in the present application will be briefly described below.

[1] In a semiconductor integrated circuit comprising an internal voltage generating circuit (2) and an internal circuit (3) which is operated by receiving supply of the operation power source voltage from the internal voltage generating circuit, the internal voltage generating circuit includes a voltage generating circuit (10) for generating a second voltage (Vref) from a first voltage (Vext) supplied from an external side of the semiconductor integrated circuit and an output buffer (11) for generating a third voltage (Vint), to be supplied as the operation power source voltage to the internal circuit, in accordance with the second voltage. Moreover, a first switch (15) for enabling an output node of the second voltage to become conductive to the predetermined potential and a control circuit for turning ON the first switch for the predetermined period in response to the first voltage turned ON are also provided. The predetermined voltage is, for example, the ground voltage of the circuit.

According to the means described above, since an output terminal of the output buffer is not clamped to the predetermined potential when the operation power source voltage resulting from the first voltage is turned ON and an output of the voltage generating circuit in the preceding stage is clamped to the predetermined voltage, a size of transistor in the first switch for clamping of voltage can be reduced remarkably than that of output transistor in the output buffer, not resulting in increase in the occupation area of chip. Since rise of an output of output buffer is controlled with the clamping operation of an output buffer input stage by the first switch when an output of each circuit rises due to an input from the preceding stage at turning ON of the power supply voltage. Thus, overshoot does not occur even when the influence of rise of the power source voltage is applied to an output of the output buffer due to capacitive coupling between the output of output buffer and power supply voltage. Accordingly, overshoot of the third voltage assumed as the operation power source voltage of the internal circuit is controlled or alleviated. Since the switch using a large size transistor for clamping the output terminal of output buffer to the predetermined potential is not required, a through-current does not increase in the voltage generating circuit when the power supply voltage is turned ON and moreover a longer time is not required for stabilization of an output voltage after turning ON of the power supply voltage.

According to the practical profile of the present invention, the voltage generating circuit comprises a standard voltage generating circuit (12) for generating the standard voltage (Vbgr) from the first voltage (Vext) and a pre-buffer (13) for generating a second voltage (Vref) by receiving the standard voltage.

In this case, a second switch (16) is provided to enable an output node of the standard voltage to become conductive to the predetermined potential, and the control circuit turns ON the second switch for the predetermined period in response to input of the first voltage. A level of the input stage of the output buffer when the power supply voltage is turned ON is further stabilized by providing also a means similar to that of the input stage of output buffer to the input stage of pre-buffer. As a result, overshoot in the output stage of output buffer can be more effectively controlled or alleviated.

In addition, a third switch (16A) for enabling a bias voltage supplying path of a current source for applying an operation current to become conductive to the pre-buffer is to the predetermined potential is also provided. The control circuit turns ON the third switch for the predetermined period responding to turning ON of the first voltage. The predetermined potential is a voltage in the direction for squeezing the operation current of the pre-buffer, namely a voltage in the direction for squeezing the current source, for example, the ground voltage of circuit. The level of the input stage of output buffer when the power supply voltage is turned ON can further be stabilized and overshoot in the output stage of output buffer can be controlled or alleviated more effectively.

According to another profile of the present invention, the control circuit further controls, after the predetermined period has passed, the output buffer to a low output impedance state from a high output impedance state. Control or alleviation effect of overshoot in the output stage of output buffer can further be improved by setting the output buffer to the high output impedance state when the power supply voltage is turned ON. Self-power consumption can also be reduced.

[2] According to another profile of the present invention, the clamping position when the power supply voltage is turned ON may be selected to an output stage of the standard voltage generating circuit to form the voltage generating circuit except for the output terminal of output buffer and the output of voltage generating circuit, in other words, to an input stage of pre-buffer to output the second voltage. Accordingly, when the power supply voltage is turned ON, the output stage of pre-buffer can be stabilized and overshoot can be controlled or alleviated, after all, in the output stage of the output buffer.

[3] As an additional technical means which is common to both profiles described above, a MOS transistor forming the internal voltage generating circuit is defined as a high voltage MOS transistor (high breakdown voltage MOS transistor), while a MOS transistor forming the internal circuit is defined as a low voltage MOS transistor (low breakdown voltage MOS transistor). In other words, the MOS transistor forming the internal voltage generating circuit includes a gate oxide film of a first thickness, while the MOS transistor forming the internal circuit includes a gate oxide film of a second thickness smaller than the first thickness. In short, the internal voltage generating circuit is assumed as a voltage step-down circuit. A part connected to an external circuit of the chip is driven with an external voltage (Vext) for compatibility with an external system and the internal circuit is driven with a third voltage (Vint) which is suitable for operation of the device which has realized ultra-microminiaturization, high integration density and low power consumption. Here, the breakdown voltage of device is only several tens of percentage for the rated voltage in both high voltage MOS transistor and low voltage MOS transistor. Particularly, since the gate oxide film of the high voltage MOS transistor is thick and the minimum Lg thereof is rather small, a parasitic capacitance of the MOS transistor forming the internal voltage generating circuit becomes large in order to obtain the equal output current. Coupling noise when the power supply voltage rises is proportional to an external voltage (Vext). Since dielectric strength of internal circuit is proportional to the third voltage (Vint), the larger the ratio of the external voltage (Vext) to the third voltage (Vint) is, the larger the problem of overshoot becomes. Since the oxide film of the low voltage MOS transistor is thin, a problem rises here, in which the semiconductor integrated circuit is broken or reliability is lowered due to the overshoot of the voltage step-down circuit.

The control circuit is a power-on reset circuit for instructing power-on rest in response to input of the first voltage. In this case, the predetermined period is shorter than the reset period.

As the practical profile, the internal circuit includes, for example, a central processing unit and a memory, while the semiconductor integrated circuit may be realized as a microcomputer or the like.

Moreover, as the other practical profile, the internal circuit includes a plurality of non-volatile memory cells connected, for example, to the word lines in the selection terminals and to the bit lines in the data terminals and address decoders for selecting memory cells by decoding the address signal, and the semiconductor integrated circuit is realized as a programmable non-volatile memory LSI represented by a flash memory.

The effects of the typical inventions disclosed in this specification will be described briefly.

Namely, overshoot when the power supply voltage is turned ON can be controlled or alleviated without increase in the occupation area of chip in the voltage generating circuit mounted on the semiconductor integrated circuit.

Namely, overshoot when the power supply voltage is turned ON can be controlled or alleviated without increase in the through-current in the voltage generating circuit mounted on the semiconductor integrated circuit.

Moreover, overshoot when the power supply voltage is turned ON can be controlled or alleviated without requiring a longer time for stabilization of an output voltage after the power supply is turned ON in the voltage generating circuit mounted on the semiconductor integrated circuit.

DETAILED DESCRIPTION OF THE PREFERRED EMBODIMENTS

Figure 1:
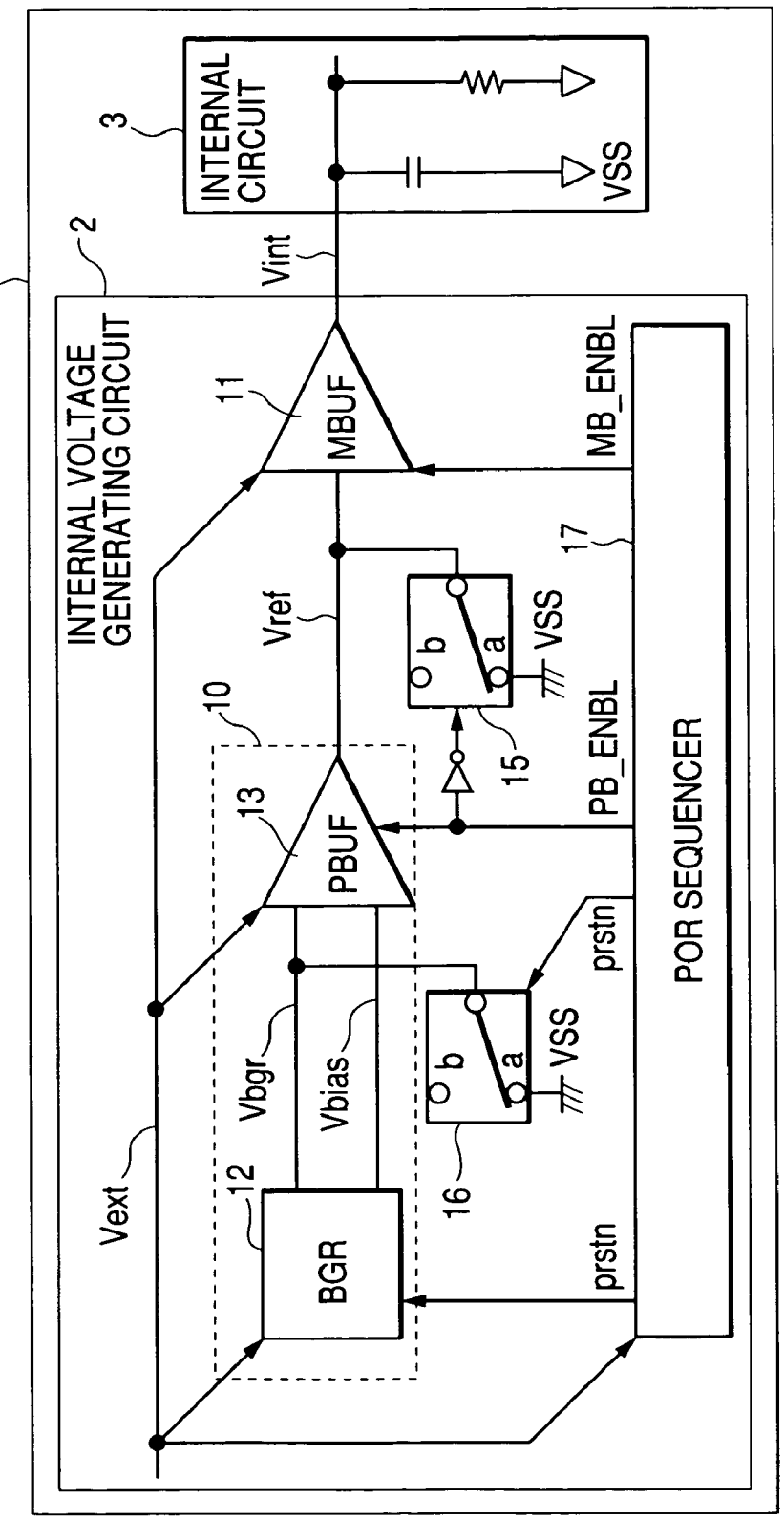
FIG. 1 is a circuit diagram mainly illustrating an internal voltage generating circuit as an example of a semiconductor integrated circuit in relation to the present invention.

FIG. 1 illustrates an example of a semiconductor integrated circuit in relation to the present invention mainly for an internal voltage generating circuit. In this semiconductor integrated circuit 1 illustrated in FIG. 1, an internal voltage generating circuit 2 and an internal circuit 3 which operates by receiving supply of the operation power source from the internal voltage generating circuit 2 are typically illustrated. For the internal circuit 3, a resistor and a capacitor are equivalently indicated as a load. The semiconductor integrated circuit 1 is formed by the complementary MOS integrated circuit manufacturing technology, for example, over a semiconductor substrate such as single crystal silicon.

The internal voltage generating circuit 2 comprises a voltage generating circuit 10 for generating a reference voltage Vref as a second voltage from an external voltage Vext as a first voltage supplied from an external circuit of the semiconductor integrated circuit and a main buffer (MBUF) 11 as an output buffer for generating an internal voltage Vint as a third voltage corresponding to the reference voltage Vref. The internal voltage Vint is supplied to the internal circuit 3 as the operation power source. Here, the voltage generating circuit 10 comprises a standard voltage generating circuit (BGR) 12 for generating a standard voltage Vbgr from the external voltage Vext and a pre-buffer (PBUF) 13 for generating the reference voltage Vref by receiving the standard voltage Vbgr. The pre-buffer 13 receives, with a current source transistor (not illustrated), a bias voltage Vbias outputted from the standard voltage generating circuit 12 and forms an operation current of this current source transistor. Here, a serial regulator is formed of the pre-buffer 13 and main buffer 11.

In order to alleviate the overshoot of the internal voltage Vint when the external voltage Vext is inputted, a first switch 15, a second switch 16, and a power-on reset sequencer (POR sequencer) 17 as a control circuit are provided. The first switch 15 enables an output node of the internal voltage Vint to become conductive to the predetermined potential, for example, to the ground voltage VSS. The first switch 15 inputs an inverted signal of the control signal PB_ENBL and is clamped to the side a while the inverted signal is high (H) level for enabling to become conductive to the predetermined potential, for example, to the ground voltage VSS of the circuit. Moreover, when the inverted signal of the control signal PB_ENBL is low (L) level, the first switch 15 is switched to the side b. The second switch 16 enables an output node of the standard voltage Vbgr to become conductive to the predetermined potential, for example, to the ground voltage VSS of the circuit. The second switch 16 inputs the control signal prstn as the input signal, is switched to the side a while the control signal prstn is high level and made conductive to the predetermined potential, for example, to the ground voltage VSS of the circuit. Moreover, when the control signal prstn becomes low level, the second switch 16 is switched to the side b. The switches 15 and 16 are formed, for example, of an n-channel MOS transistor. The POR sequencer 17 controls the switches to turn ON the first switch 15 for the predetermined period with the inverted signal of the control signal PB_ENBL in response to input of the external voltage Vext and also turn ON the second switch 16 for the predetermined period with the control signal prstn. The POR sequencer 17 further instructs, with the control signal prstn, the standard voltage generating circuit 12 to execute the startup operation only for the predetermined period to enable, with the control signal PB_ENBL, the pre-buffer 13 to perform the output operation of the pre-buffer 13 after the predetermined period has passed and also to enable, with the control signal MB_ENBL, the main buffer 11 to perform the output operation through the switching to the low output impedance state from the high output impedance state after the predetermined period has passed.

Figure 2:
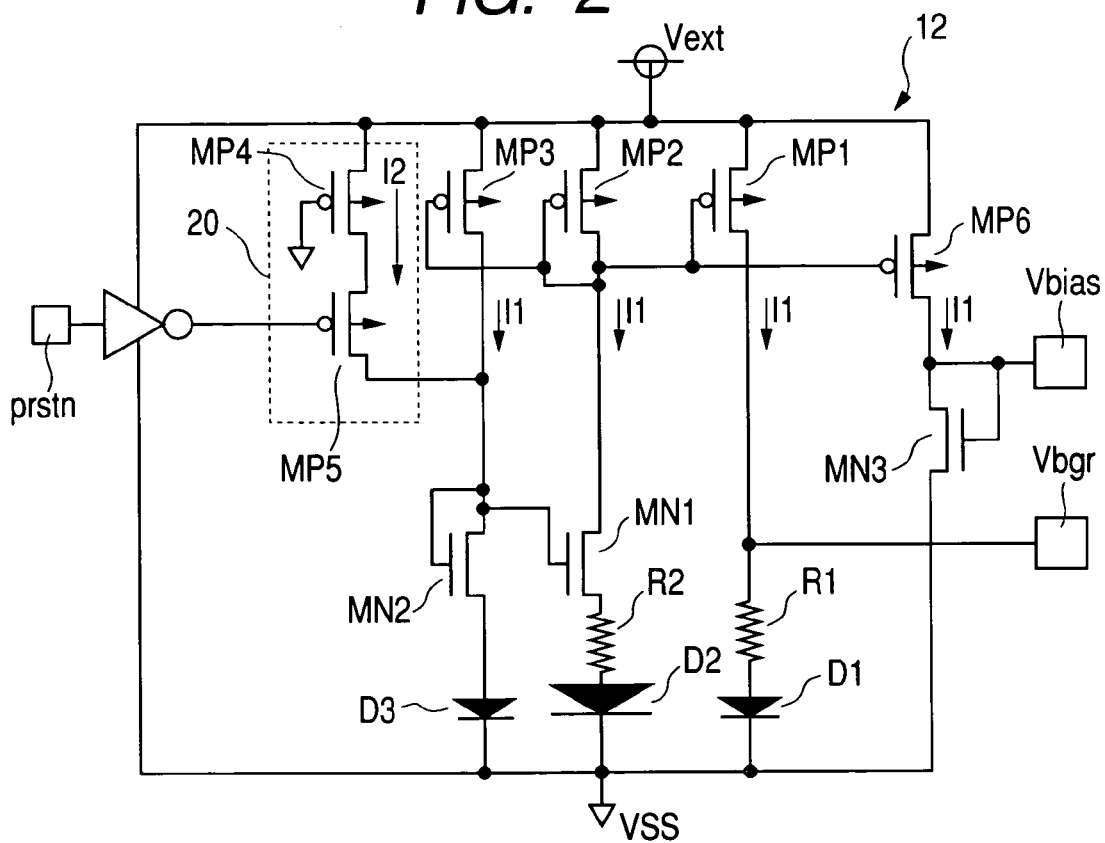
FIG. 2 is a circuit diagram illustrating an example of a standard voltage generating circuit.

FIG. 2 is an example of the standard voltage generating circuit 12. The circuit illustrated in the FIG. 2 is formed as a Widler type band gap standard voltage generating circuit. MP1 to MP6 indicate the p-channel MOS transistors; MN1 to MN3, n-channel MOS transistors; R1 and R2, resistors; and D1 to D3, diodes.

The MOS transistors MP1 to MP3 are respectively formed as current sources. Since the gates of the MOS transistors MP1, MP3, MP6 are connected in common to the gate and drain of the MOS transistor MP2, thereby to form a current Miller circuit. In the steady state, an equal current I1 flows respectively into the MOS transistors MP1 to MP3 and MP6. The current source circuit formed of the MOS transistors MN1, MP2, MP3, and MN2 also has the stable point in 0 ampere (current 0) not assumed in addition to the predetermined value I1 of the current value. Therefore, a circuit to escape from the current 0 when the circuit is driven is required. The MOS transistors MP4, MP5 connected in direct to the common drain of the MOS transistors MN2 and MP3 form a startup circuit (starting circuit), the control signal prstn is set to the high level when the external power supply voltage Vext is inputted, whereby the current 12 is supplied, and a current is easily applied to a current path of the MOS transistor MP2. A bonding area of the diode D2 is set to n times the bonding area of the diodes D1 and D3. Since the source voltage of the MOS transistors MN1 and MN2 is set equal by setting a current density of NM1, MN2 to the identical value, difference between the anode and cathode of the diodes D3 and D2 appears as a difference in both ends of the resistor R2. A voltage across the anode and cathode of diode has he negative temperature characteristic and the resistance values of resistor elements R1, R2 has the positive temperature characteristic. The variation-free standard voltage Vbgr depending on temperature and power supply voltage Vext can be obtained at the drain of the MOS transistor MP1 by determining a size ratio of the diodes D2 and D1 and a resistance ratio of the resistor elements R1 and R2 in order to cancel both temperature characteristics. Moreover, a bias voltage Vbias is formed to generate a current which is fixed to a certain degree at the gate and drain of the MOS transistor MN3.

Since the standard voltage generating circuit 12 is driven, as described above, when the MOS transistor MP5 of the startup circuit 20 is driven to become ON with the control signal prstn when the external voltage Vext is inputted, a drain voltage of the MOS transistor MN2 rises. The standard voltage Vbgr tries, following such rise of drain voltage, to rise higher than the voltage value under the ordinary state (condition where the MOS transistor MP5 is turned OFF after stabilization the power supply voltage Vext). However, since the output terminal of the standard voltage Vbgr is pulled down, when the external voltage Vext is inputted, because it is made conductive to the ground voltage VSS of the circuit with the second switch 16, even when the startup circuit 20 is operated, level of the standard voltage Vbgr is not increased. After the startup circuit 20 is disabled because the control signal prstn is set to the low level, the standard voltage Vbgr is returned to the ordinary specified level.

Figure 3:
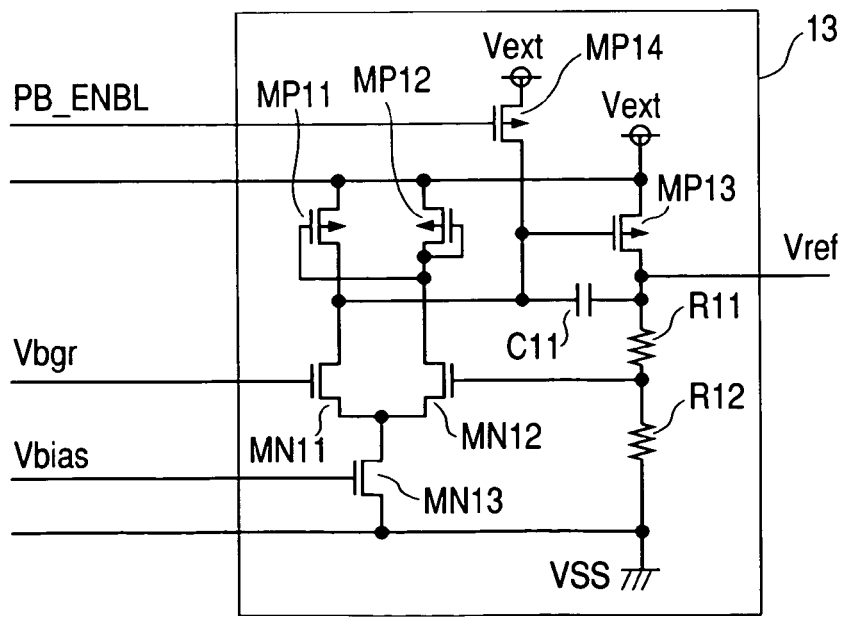
FIG. 3 is a circuit diagram illustrating an example of a pre-buffer.

FIG. 3 illustrates an example of the pre-buffer 13. In FIG. 3, MP11 to MP14 are p-channel MOS transistors; MN11 to MN13, n-channel MOS transistors; C11, a capacitance element; R11, R12, resistance elements.

The pre-buffer 13 comprises: a differential amplifying circuit formed of MOS transistors MP11, MP12 as a current Miller loads, MOS transistors MN11, MN12 as differential input elements, and MOS transistor MN13 as a constant current element; an output stage circuit formed of the MOS transistor MP13, resistance elements R11, R12, and capacitance element C1; and the MOS transistor MP14 as an enable switch of the output stage. The bias voltage Vbias is supplied to the gate of MOS transistor MN13. The enable signal PB_ENBL is supplied to the gate of MOS transistor M14. The standard voltage Vbgr is supplied to the gate of MOS transistor MN11 as one differential input, while a connection node of the resistance elements 11 and 12 is connected, through a feedback loop, to the gate of MOS transistor MN12 as the other differential input.

The pre-buffer 13 is formed as a negative feedback amplifying circuit and the differential amplifying circuit operates, as a voltage follower circuit, to set the gate potential of MOS transistor MN12 to equal to the standard voltage Vbgr. With operation of this differential amplifying circuit 1, the reference voltage Vref which is equal to Vbgr×(R11+R12)/R12 is formed.

When the external power supply voltage Vext is inputted, the MOS transistor MP14 is maintained in the ON state with the control signal PB_ENBL until the predetermined period has passed in order to cut off the MOS transistor MP13. If such cut-off control is unnecessary (the MOS transistor MP14 is not provided) since a gate potential of the MOS transistor MP13 when the power supply is inputted is in the intermediate potential, the relevant MOS transistor MP13 becomes the conductive state and a current flows out to the output terminal of the reference voltage Vref via this MOS transistor MP13. Although this output current is controlled with operation of the differential amplifying circuit, delay of feedback voltage for the gate of MOS transistor MP13 is rather large when the power supply is driven, control of current by the MOS transistor MN13 is delayed, and overshoot of reference voltage Vref may be generated. In the circuit of FIG. 3, in regard to this point, the MOS transistor MP13 is cut off when the external power supply voltage Vext is inputted, the output terminal of the reference voltage Vref is moreover pulled down because this output terminal is made conductive to the ground voltage VSS of the circuit with the first switch 15, and moreover the level of reference voltage Vref is lowered because the standard voltage Vbgr is also controlled not to rise.

Figure 4:
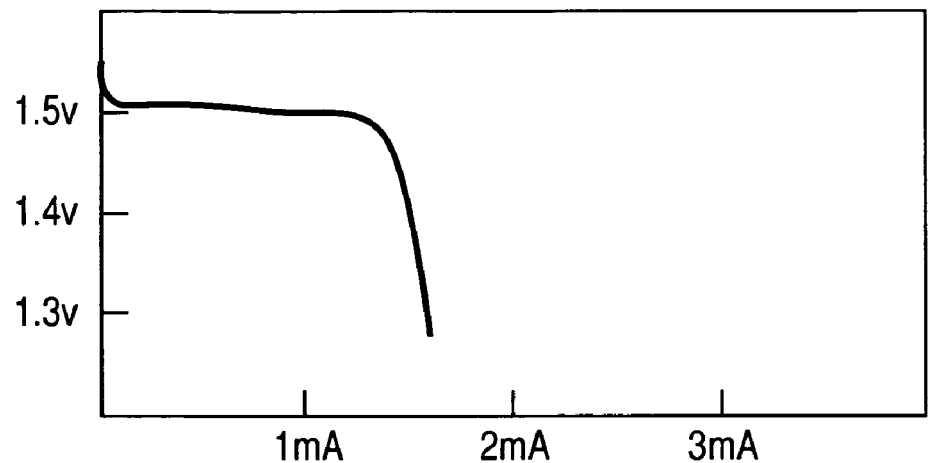
FIG. 4 is an explanatory diagram illustrating an example of a load drive characteristic of the pre-buffer.

FIG. 4 illustrates an example of the load drive characteristic of the pre-buffer 13. A driving force of the pre-buffer 13 may be remarkably smaller than that of the main buffer 11. For example, it is enough when the pre-buffer 13 has the driving force equal to that illustrated in FIG. 4. Accordingly, a size of the MOS transistor forming the switch 15 to clamp an output of the pre-buffer 13 to the ground voltage VSS of the circuit may be reduced to a remarkably small value in comparison with that for clamping an output of the main buffer 11 with the pull-down MOS transistor. This is also true to the size of MOS transistor of the switch 16 for clamping the standard voltage Vbgr of the BGR 12.

The main buffer 11 must be located near the load and it is therefore arranged through distribution method over the chip of semiconductor integrated circuit. In this case, when it is required to clamp an output of the main buffer 11, a wiring area for distributing the clamping control signal is necessary. Since the number of pre-buffers 13 to be arranged is smaller than that of the main buffer 11, it is not required to consider increase in the wiring area and fluctuation in the drive period in regard to such signal distribution.

Figure 5:
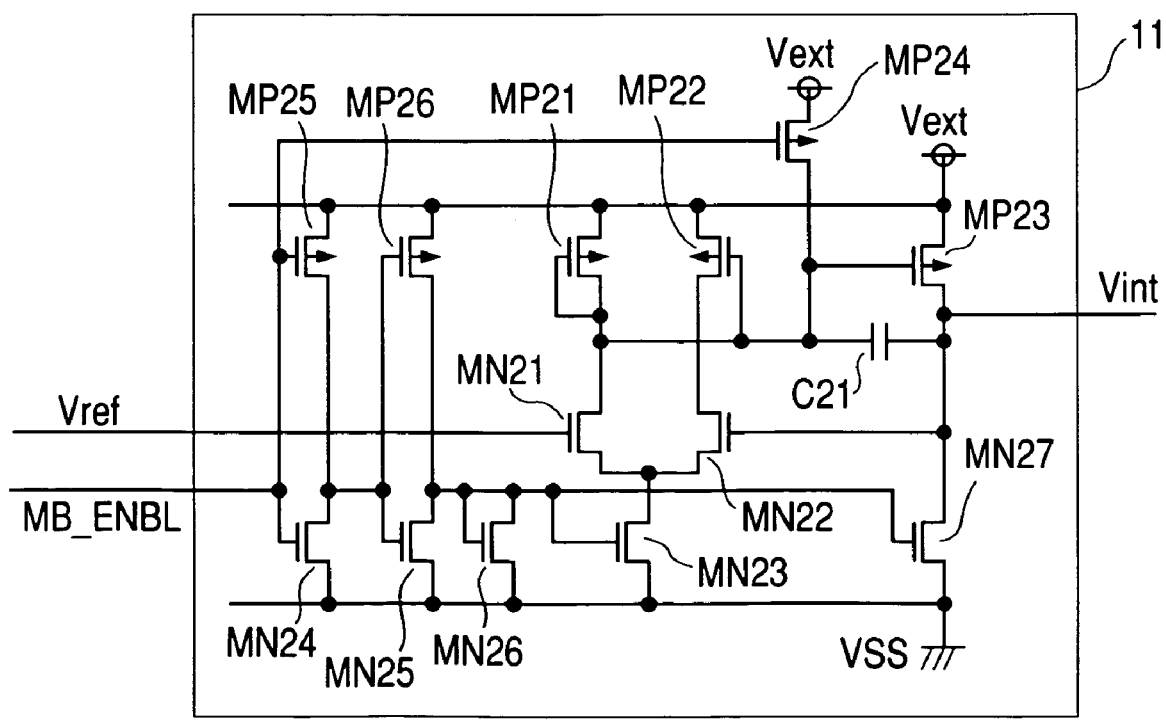
FIG. 5 is a circuit diagram illustrating an example of a main buffer.

FIG. 5 illustrates an example of the main buffer 11. In FIG. 3, MP21 to MP26 are p-channel MOS transistors; MN21 to MN27, n-channel MOS transistors; and C21, a capacitance element.

The main buffer 11 comprises: a differential amplifying circuit formed of the MOS transistors MP21, MP22 as the current Miller loads, MOS transistors MN21, MN22 as differential input elements and a MOS transistor MN23 as a constant current element; an output stage circuit formed of MOS transistors MP23, MN27 and capacitance element C1; a MOS transistor MP24 as an enable switch in the output stage; and MOS transistors MP25 to MP26, MN24 to MN26 to form a current source. The current flowing through the MOS transistor MN26 is also supplied to the MOS transistors MN23, MN27 under the condition that the enable signal MB_ENBL is maintained in the high level. This enable signal MB_ENBL is also supplied to the gate of MOS transistor MP24. The reference voltage Vref is supplied to the gate of MOS transistor MN21 as one differential input and the internal voltage Vint is connected through the feedback loop to the gate of MOS transistor MN22 as the other differential input.

The main buffer 11 is formed as a negative feedback amplifying circuit and the differential amplifying circuit operates as a voltage follower circuit to make the gate potential of MOS transistor MN22 equal to the reference voltage Vref. With operation of this differential amplifying circuit 1, the internal voltage Vint in the level equal to the reference voltage Vref is formed.

At turning ON of the power supply, since the control signal MB_ENBL is set to the low level until the predetermined period has passed, the MOS transistor MP23 and MN27 are cut off and the main buffer 11 is set to the high output impedance state. If the main buffer is controlled to the low output impedance state at turning ON of the external power supply, since the gate potential of the MOS transistor MP23 is set to the intermediate potential at turning ON of the power supply, the relevant MOS transistor MP23 becomes conductive state and a current is led to the output terminal of the internal voltage Vint via the MOS transistor MP23. At turning ON of the external power supply, since the operation point of the differential amplifying circuit is different, control of the MOS transistor MN23 is delayed. Moreover, since the MOS transistor MN23 is turned OFF with delay even when the potential of the relevant output terminal becomes higher than the voltage value in the steady state, overshoot is likely to occur in the internal voltage Vint. In regard to this point, the MOS transistors MP23 and MN27 are cut off in the circuit of FIG. 5 because the control signal MB_ENBL is controlled to the low level when the external power supply is turned ON, and floating of the internal voltage Vint due to unstable internal node of the main buffer 11 at turning ON of the external power supply can be controlled. During this period, the external voltage Vext is stabilized. Since the input terminal of the reference voltage Vref is pulled down since it is made conductive, for example, to the ground voltage Vss with the first switch 15 prior to that the buffers 13, 11 are capable of executing the normal operation, if the main buffer 11 is shifted to the low output impedance state, the internal voltage Vint rises without generation of overshoot because the target level of the internal voltage Vint is low.

Figure 6:
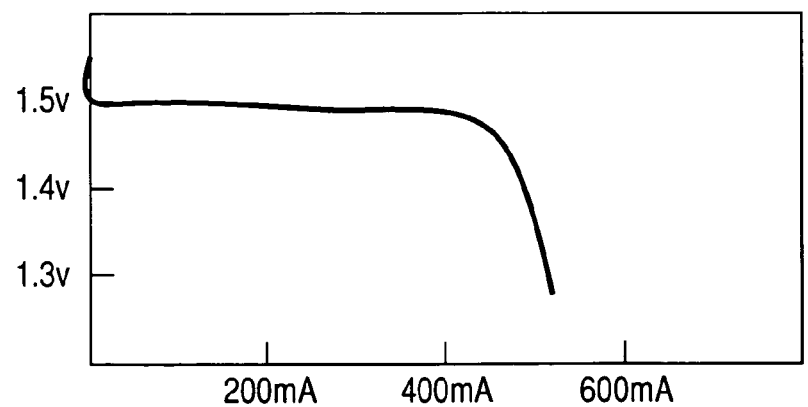
FIG. 6 is an explanatory diagram illustrating an example of a load drive characteristic of the main buffer.

FIG. 6 illustrates an example of the load drive characteristic of the main buffer 11. This characteristic shows, for example, a total current of the main buffers arranged within a semiconductor integrated circuit. The main buffer 11 has the current drive capability which is distinctively larger than that of the pre-buffer 13, as illustrated in FIG. 6, in order to supply the operation current to the internal circuit such as a CPU or the like connected to an internal step-down voltage Vint.

Figure 7:
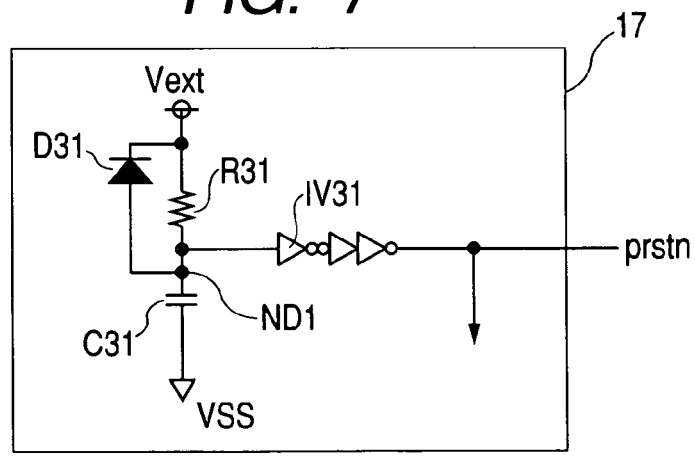
FIG. 7 is a circuit diagram illustrating an example of logic for generation of a control signal prstn.
Figure 8:
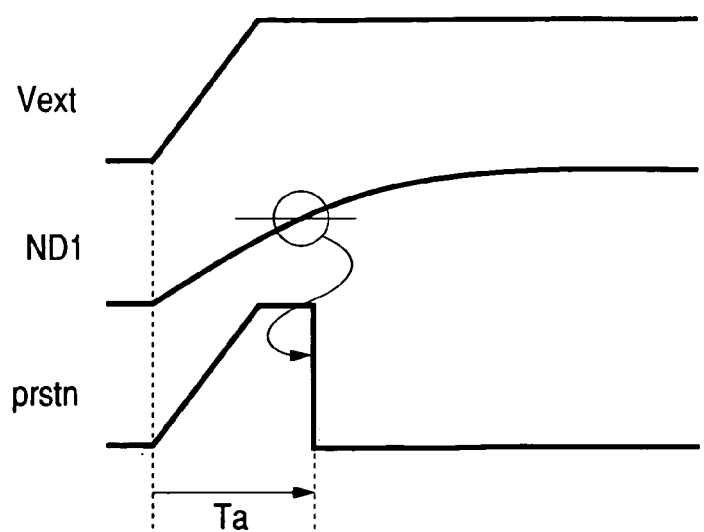
FIG. 8 is a waveform diagram of the control signal prstn generated by a logical value of FIG. 7.

FIG. 7 illustrates an example of a logic for generating the control signal prstn. FIG. 8 illustrates an example of waveform of the control signal prstn generated by the logic. When the external voltage Vext is inputted, a voltage of the node ND1 rises in accordance with a CR time constant of the resistance element R31 and capacitance element C31. The control signal prstn is set to the high level until this level reaches the threshold voltage of the inverter IV31 and is then inverted to the low level when the level of node ND1 exceeds the threshold voltage. The diode D31 is provided to discharge the potential of the node ND1 when the power supply is cut off.

Figure 9:
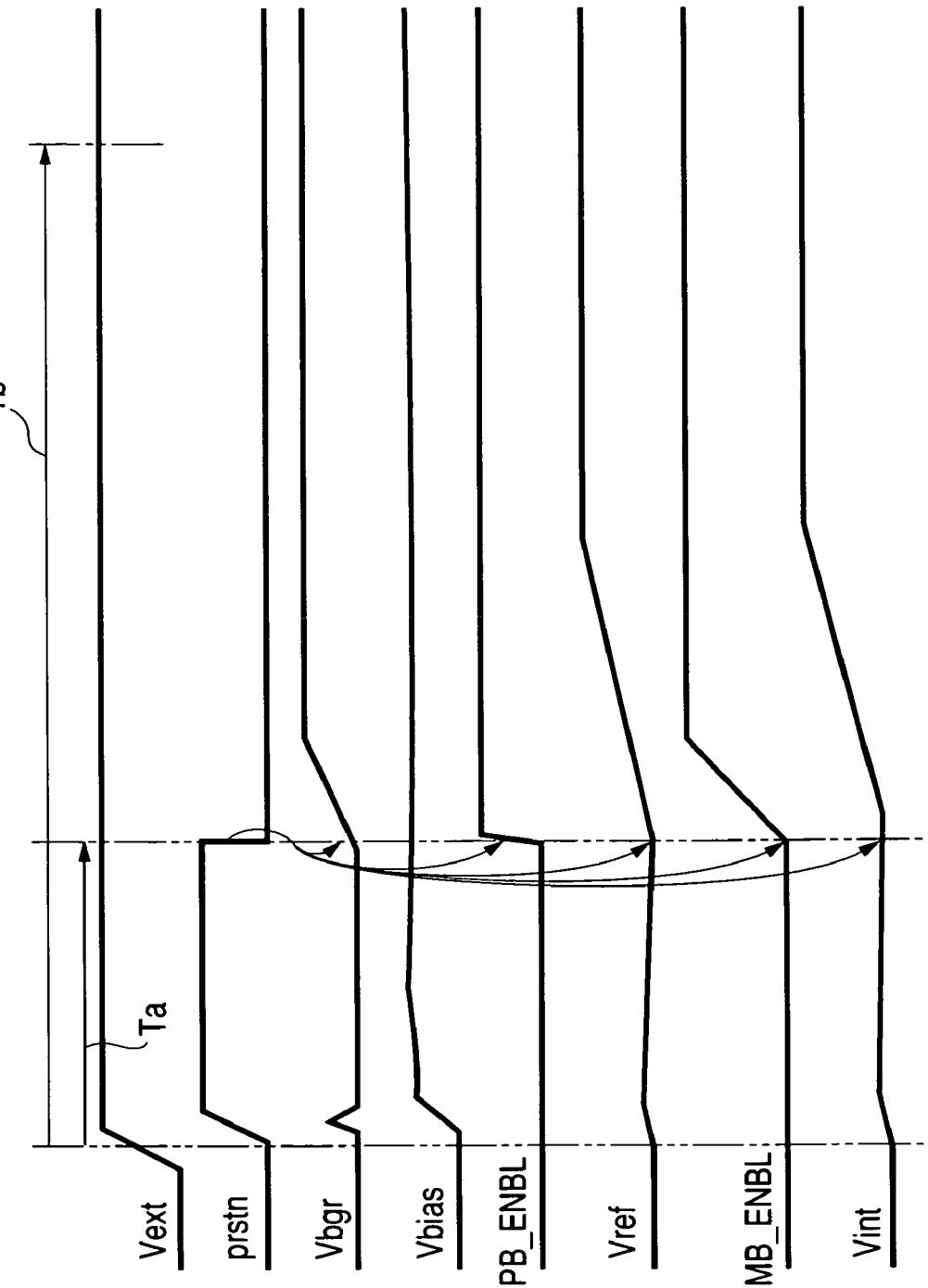
FIG. 9 is an operation timing diagram of the internal voltage generating circuit.

FIG. 9 illustrates an example of operation timings of the internal voltage generating circuit 2. The period Ta until the control signal prstn is inverted to the low level from input of the external voltage Vext is defined as the predetermined period. The control signals PB_ENBL and MB_ENBL are shifted to the high level in synchronization with falling change of the control signal prstn described above. The predetermined period Ta is shorter than the power-on reset period Tb and the internal voltage Vint is stabilized when the power-on reset is cancelled.

The total operation of the internal voltage generating circuit 2 will be described on the basis of FIG. 9. In the power-on reset period Ta immediately after the input of external power supply voltage Vext, since a current of the current source within the BGR12 becomes larger than the steady value due to the supply of current of the starting circuit 20, the standard voltage Vbgr tends to become larger than the steady value. However, since the control signal prstn is in the high level, the output terminal of the standard voltage Vbgr is clamped to the ground potential Vss with the second switch 16 and the standard voltage Vbgr maintains the level. After the period Ta, since the control signal prstn is set to the low level, supply of current of the starting circuit 20 is suspended and the current source in the BGR12 returns to the steady value. Simultaneously, the second switch 16 is turned OFF to stop the clamping operation and the standard voltage Vbgr rises to the steady value. Since the standard voltage Vbgr rises from the low level, overshoot of the standard voltage Vbgr can be prevented.

When the external power supply voltage Vext is inputted, the reference voltage Vref is caused to float with the capacitive coupling between the output terminal of reference voltage Vref of the pre-buffer 13 and the power supply terminal Vext (coupling based on the parasitic capacitance between the source and drain of MP13) but this reference voltage is not floated because this voltage is clamped to the ground potential with the first switch 15. Under the condition that the standard voltage Vbgr is low level, the control signal PB_ENBL is set to the high level, the pre-buffer 13 is activated, and thereby the reference voltage Vref being clamped (pulled down) with the first switch is no longer clamped. Immediately after the activation, response of pre-buffer 13 is delayed. However, since the level of standard voltage Vbgr is low, overshoot of the reference voltage Vref can be controlled and the time required for recovery from overshoot can also be shortened. Accordingly, drive of the main buffer 11 is never delayed remarkably.

When the external power supply voltage Vext is inputted, the internal voltage Vint is also caused to float because of capacitive coupling between the output terminal of internal voltage Vint of the main buffer 11 and the external power supply terminal Vext (coupling by parasitic capacitance between the source and drain of MP23), but floating if lower than the steady value of the internal voltage Vint. The reference voltage Vref when the main buffer 11 starts the operation is lower than the potential of steady value. If, overshoot occurs in the main buffer 11, since the voltage does not exceed the specified value of the internal voltage Vint, the drive time is not delayed by such overshoot.

Figure 10:
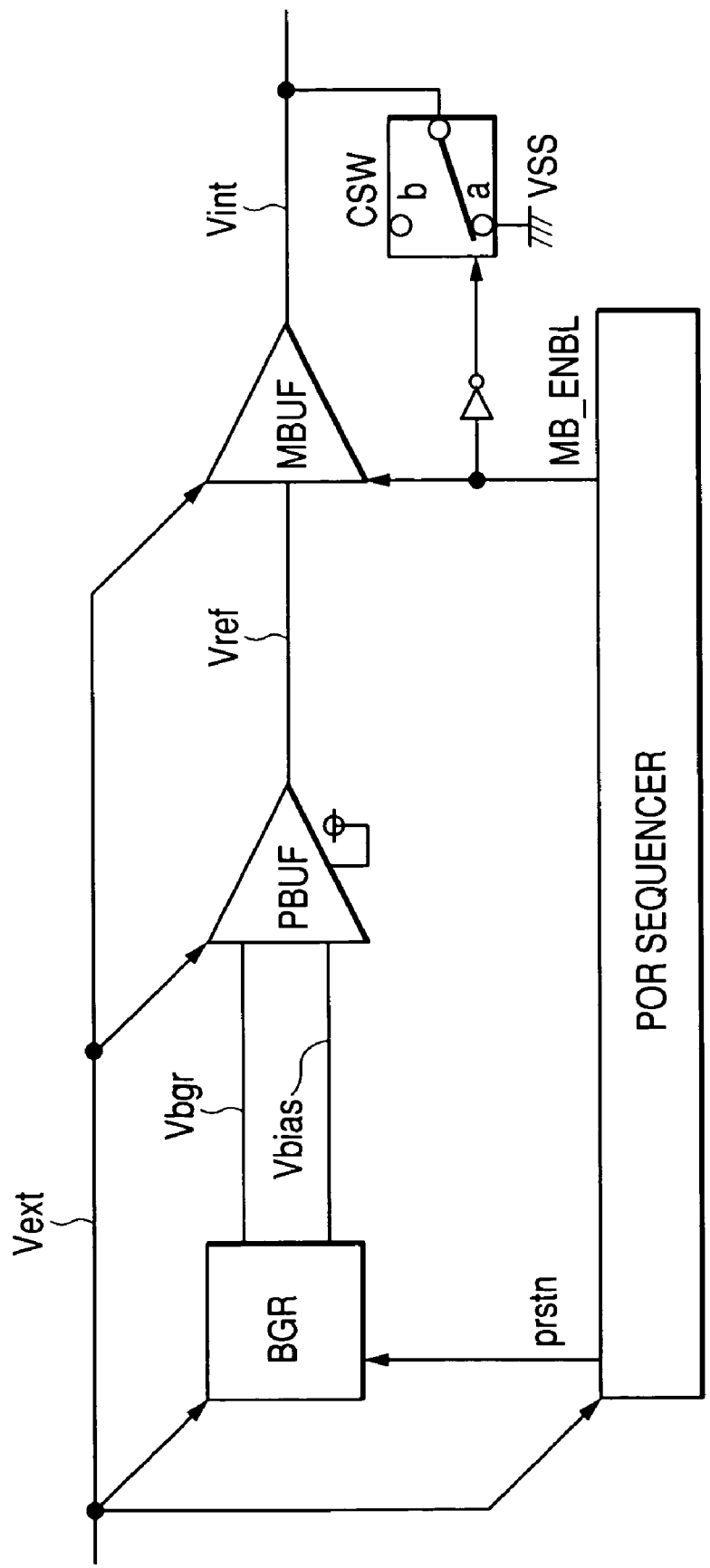
FIG. 10 is a circuit diagram of the internal voltage generating circuit in relation to a comparison example.
Figure 11:
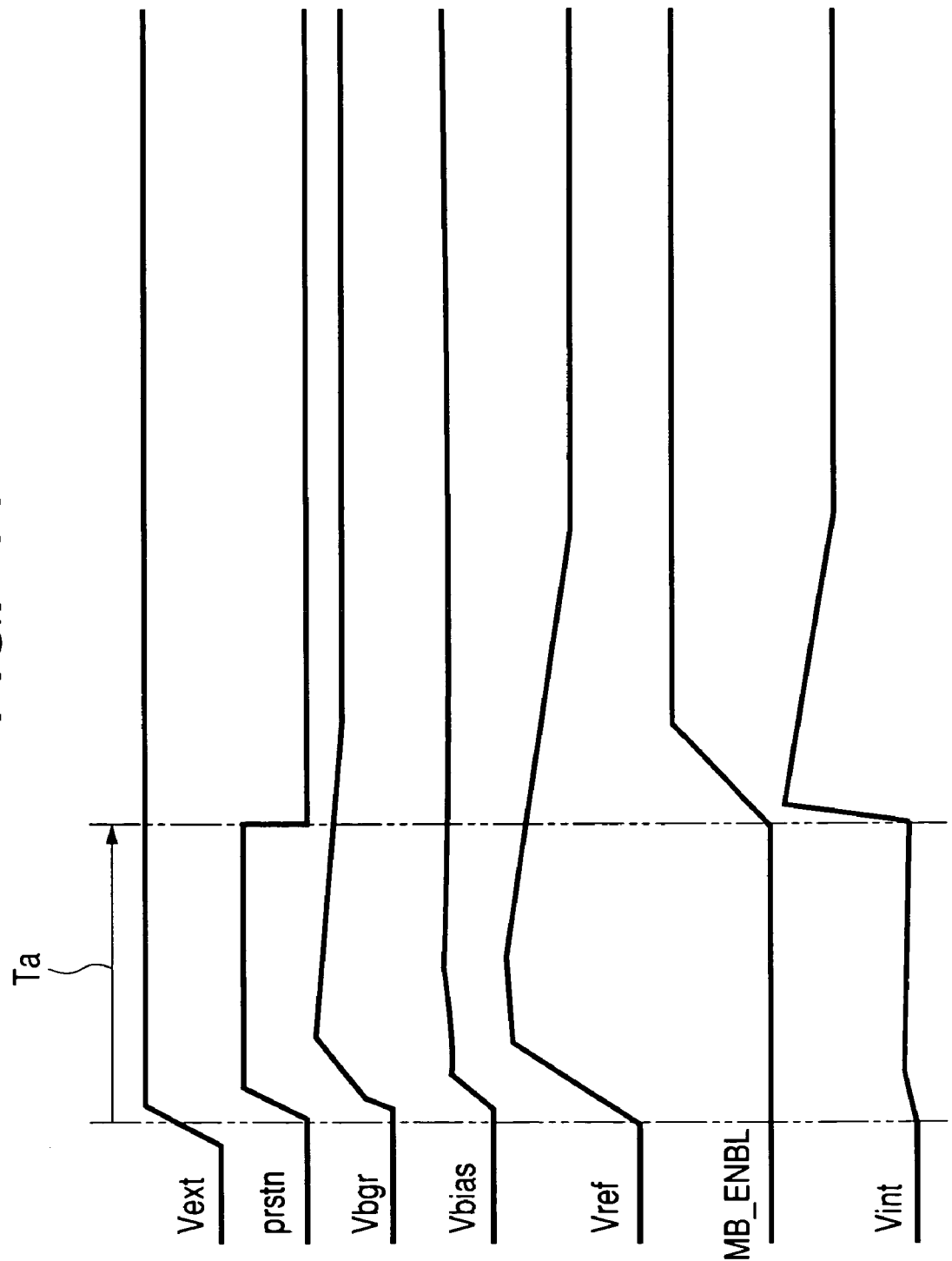
FIG. 11 is an operation waveform diagram of the internal voltage generating circuit in relation to a comparison example of FIG. 10.

FIG. 10 illustrates the internal voltage generating circuit as the comparison example. FIG. 11 illustrates an example of the operation waveforms. It is assumed here that a clamping switch (CSW) is arranged in the output stage of the main buffer (MBUF), and the band gap standard voltage generating circuit (BGR), pre-buffer (PBUF) and main buffer (MBUF) are activated following the input of external power supply voltage Vext. In this case, since the output voltage Vint of the main buffer (MBUF) is clamped via the clamp switch (CSW), overshoot of the internal voltage Vint itself is controlled within the period Ta. However, the standard voltage Vbgr and reference voltage Vref respectively rise as illustrated in FIG. 11 and overshoot occurs exceeding the specified value through the capacitive coupling with the power supply voltage Vext. Therefore, if the clamp by the clamping switch (CSW) is cancelled, since the standard voltage Vbgr and reference voltage Vref are already excessive, overshoot occurs in the internal voltage Vint. In this circuit structure, the time required for recovery from overshoot of the internal voltage Vint is restricted by the longest time among the recovery time-constant of the BGR, PBUF, MBUF. Particularly, when the currents of the PBUF and BGR are saved in order to realize low standby power, the time required for recovery from overshoot of the standard voltage Vbgr and reference voltage ref becomes longer than that of the internal voltage Vint which is an output of the MBUF. Accordingly, effect by the clamping only with the output of MBUF becomes small.

Meanwhile, following effects can be attained with the internal voltage generating circuit 2 of FIG. 1 described above.

[1] Since the output terminal of main buffer 11 is not clamped to the ground potential VSS and an output of the pre-buffer 13 in the preceding stage is clamped when the operation power supply based on the external voltage Vext is inputted, the transistor of the first switch 15 to execute the clamping may be remarkably reduced in size in comparison with the size of output transistor MP23 of the main buffer 11, not allowing increase in the area occupied with a chip.

[2] Since rise of output of the main buffer 11 is controlled with the clamping operation of the input stage of the main buffer 11 with the first switch when an output of each circuit rises due to an input from the preceding stage when the external power supply voltage Vext is inputted, overshoot does not occur even when influence of rise of power supply is applied to the output of the main buffer 11 due to the capacitive coupling between the output of main buffer 11 and the power supply voltage Vext. Accordingly, overshoot of the internal voltage Vint assumed as the operation power source of the internal circuit 3 can be controlled or alleviated.

[3] Since a switch in the large transistor size for clamping the output terminal of main buffer 11 to the predetermined potential VSS is no longer required, a through-current does not increase in the voltage generating circuit 2 when the external power supply voltage Vext is inputted, and moreover a longer time is not required for stabilization of the output voltage after the external power supply voltage Vext is inputted.

[4] The level of the input stage of main buffer 11 when the external power supply voltage Vext is inputted is further stabilized by realizing the clamping with the second switch 16 like the input stage of the output buffer 11 also for the input stage of pre-buffer 13. Accordingly, the effect of control or alleviation in overshoot in the output stage of the main buffer 11 can be still further improved.

[5] The POR sequencer 17 further controls, after the predetermined period Ta has passed, the main buffer 11 to the low output impedance state from the high output impedance state. Since the main buffer 11 is set to the high output impedance state when the external power supply voltage Vext is inputted, the effect of control or alleviation of overshoot in the output stage of main buffer 11 can further be improved and thereby low power consumption may be accelerated.

Figure 12:
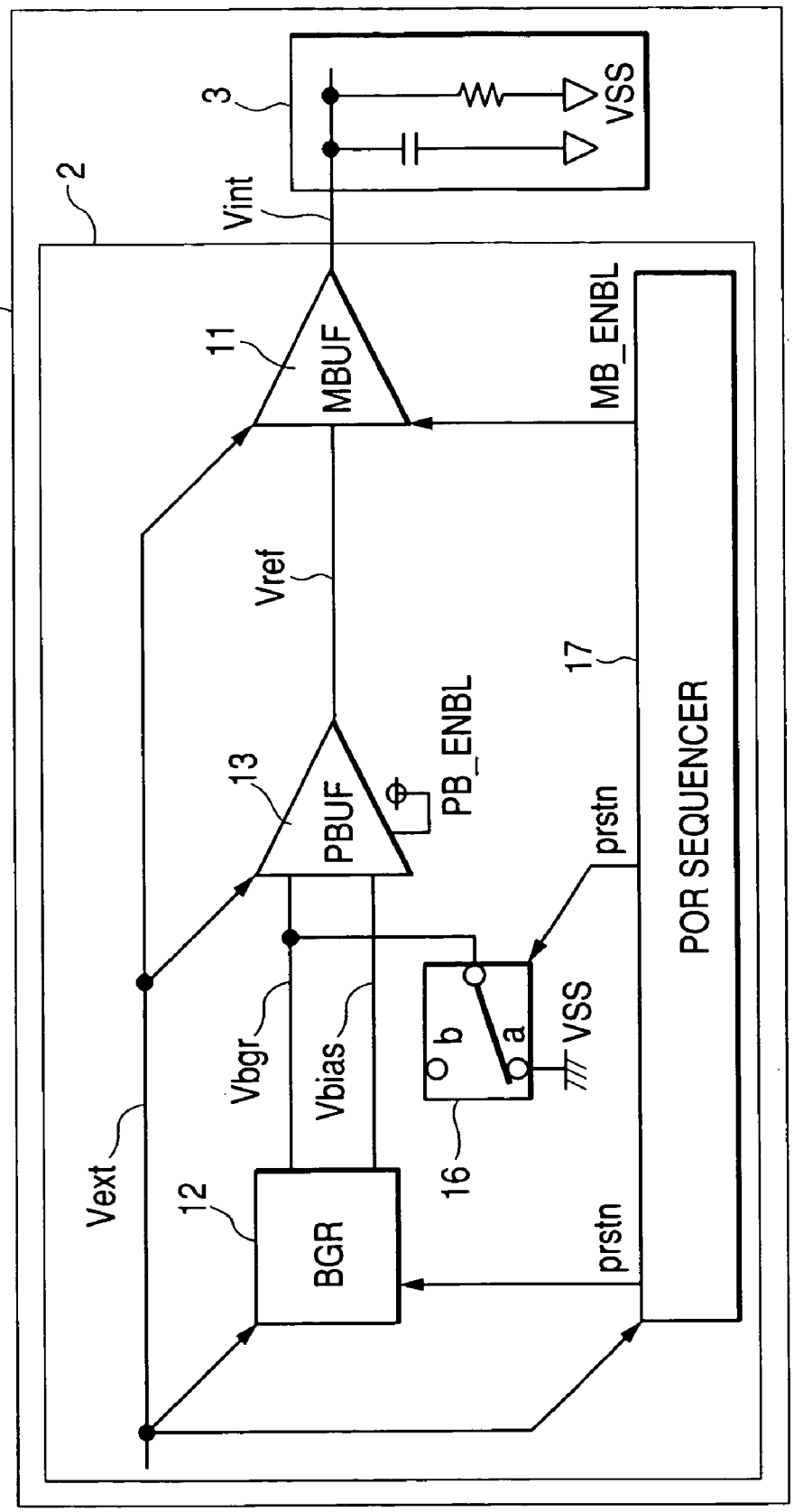
FIG. 12 is a circuit diagram illustrating another example of the internal voltage generating circuit.

FIG. 12 illustrates another example of the internal voltage generating circuit. Difference from FIG. 1 is that control for activation of the pre-buffer 13 due to the control signal PB_ENBL can be suspended and moreover the first switch 15 is eliminated. The other structure is identical to that of FIG. 1.

Figure 13:
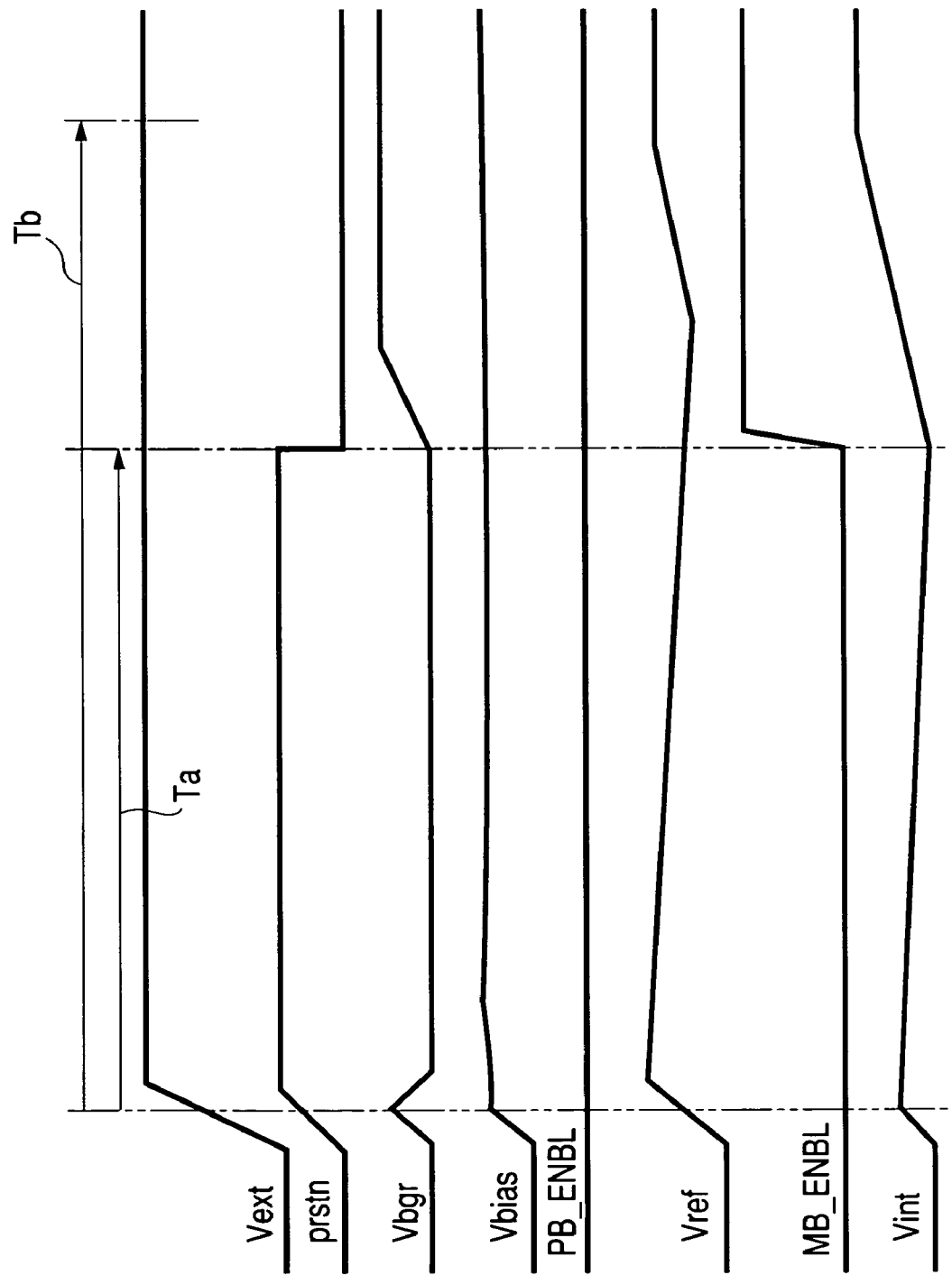
FIG. 13 is an operation waveform diagram of the internal voltage generating circuit of FIG. 12.

FIG. 13 illustrates operation waveforms of the internal voltage generating circuit of FIG. 12. When the external power supply voltage Vext is inputted, the control signal prstn is set to the high level and the startup circuit 20 is operated. However, overshoot does not occur because the output terminal of standard voltage Vbgr is clamped toward the ground voltage VSS with the second switch 16. Immediately after the external power supply voltage Vext is inputted, the output terminal of the reference voltage Vref and internal voltage Vint which is not assumed as the object of clamping is floated to a certain degree with the capacitive coupling with the external power supply voltage Vext. When the control signal prstn is set to low level after the relevant period Ta by setting this period Ta to a comparatively longer time required for sufficiently stabilizing the reference voltage Vref, the standard voltage Vbgr and reference voltage Vref rise in this sequence. Since the reference voltage Vref when the main buffer 11 starts its operation is lower than the steady value, the level is maintained at a lower value if overshoot occurs in the main buffer 11. The problem such as deterioration of reliability due to the simplification of structure for FIG. 1 is no longer generated.

Figure 14:
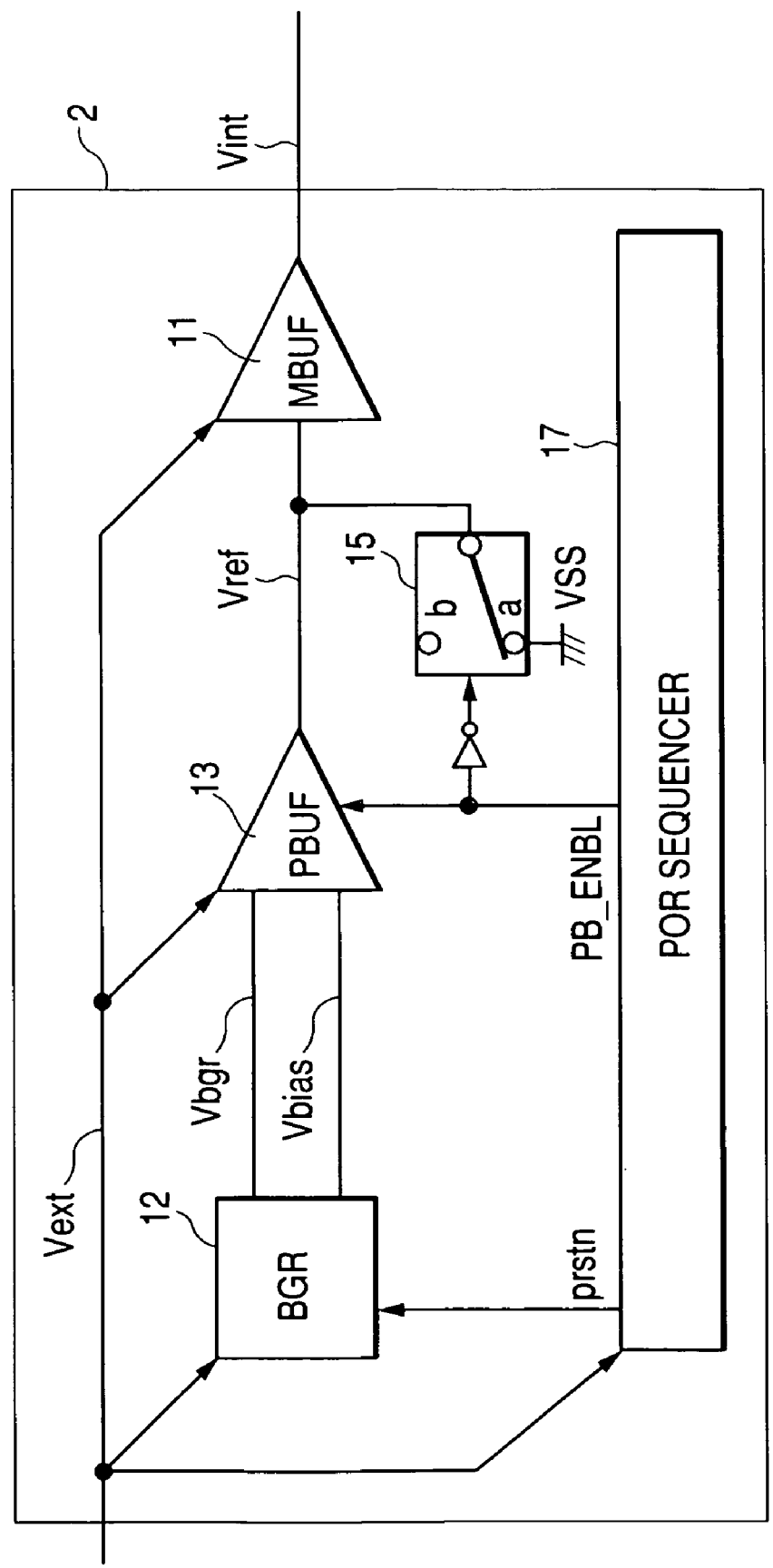
FIG. 14 is a circuit diagram illustrating another example of the internal voltage generating circuit.

FIG. 14 illustrates another example of the internal voltage generating circuit. Difference from FIG. 1 is that the second switch 16 is deleted. The other structure is identical to FIG. 1. Accordingly, the effect, which may be attained by clamping the voltage Vint toward the ground potential VSS with the switch 15 when the external voltage Vext is inputted as described in regard to FIG. 1, can also be obtained.

Figure 15:
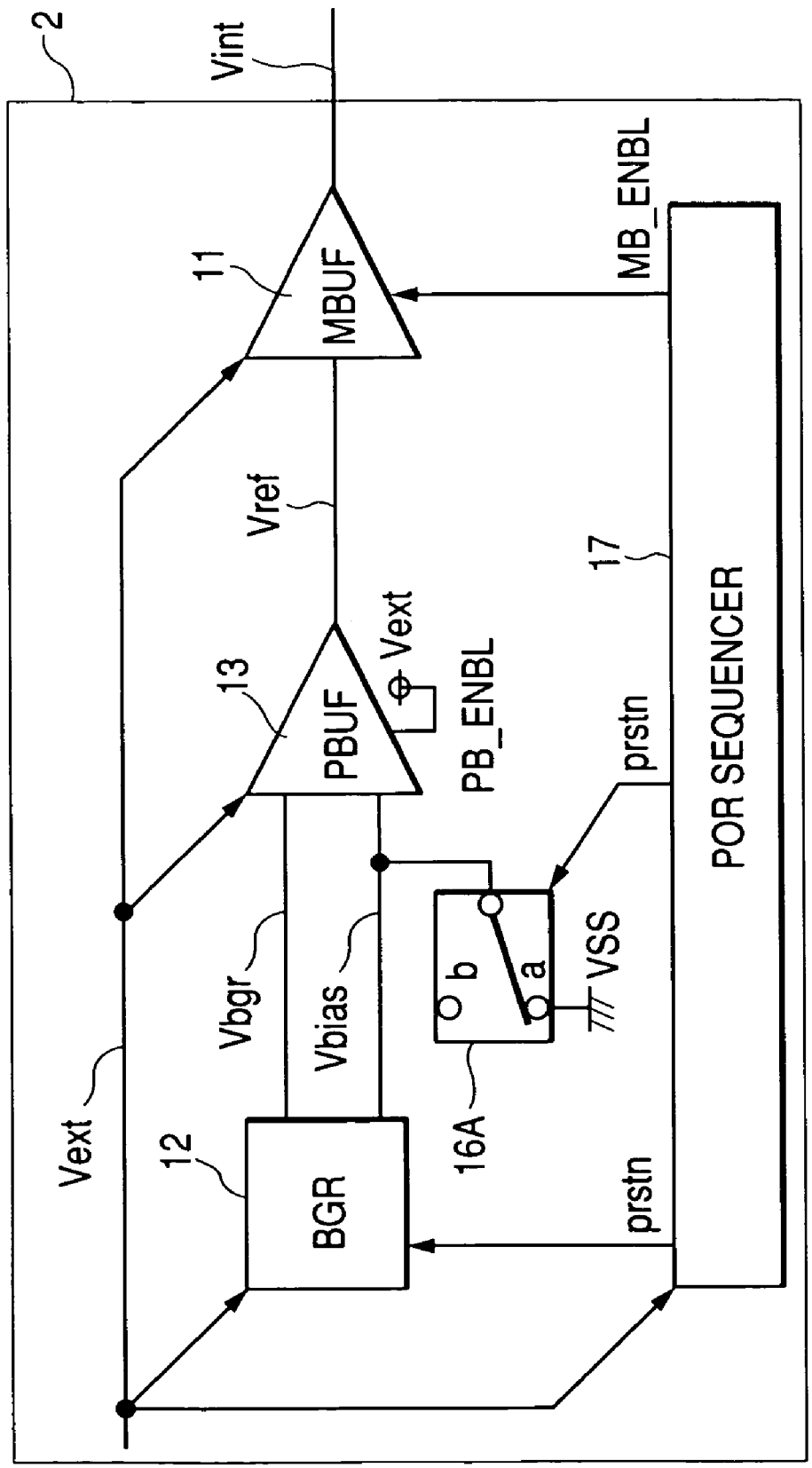
FIG. 15 is a circuit diagram illustrating another example of the internal voltage generating circuit.

FIG. 15 illustrates another example of the internal voltage generating circuit. Difference from FIG. 12 is that the third switch 16A identical to the second switch 16 is arranged in the bias voltage Vbias side. The third switch 16A receives the control signal prstn as the input signal, is switched to the side a while the control signal prstn is in the high level, and is made conductive to the predetermined potential, for example, to the ground voltage VSS of the circuit. Moreover, when the control signal prstn becomes low level, this third switch 16A is switched to the side b. When the bias voltage Vbias is clamped toward the ground potential VSS when the external voltage Vext is inputted, the differential amplifier (differential amplifier formed of MP11, MP12, MN11, MN12 and MN13 in FIG. 13) is not activated. Therefore, overshoot of the reference voltage Vref is controlled. Accordingly, the effect which is almost similar to that of FIG. 12 can be attained.

Figure 16:
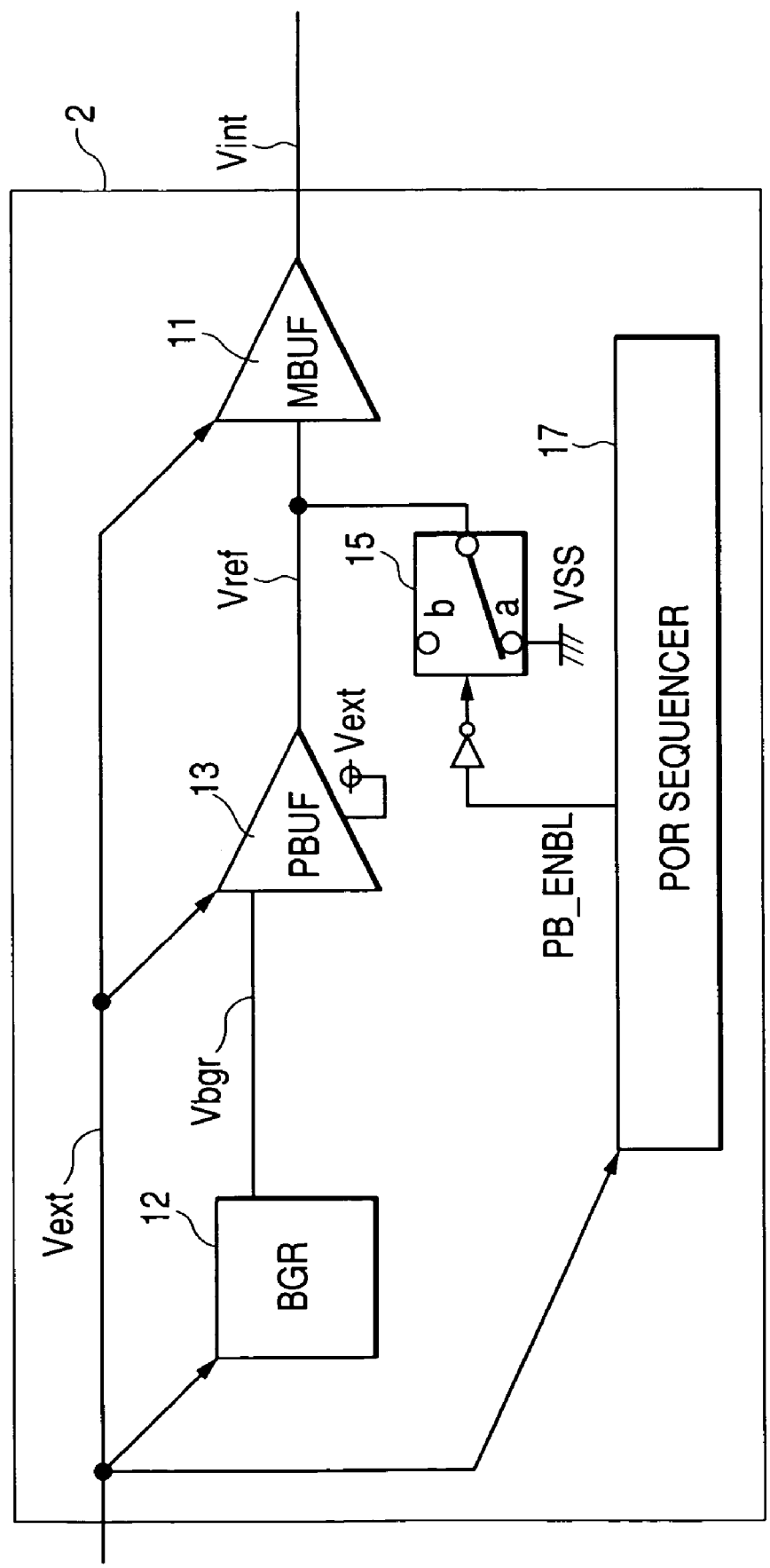
FIG. 16 is a circuit diagram illustrating another example of the internal voltage generating circuit.

FIG. 16 illustrates another example of the internal voltage generating circuit. Difference from FIG. 14 is that activation control of the pre-buffer 13 with the control signal PB_ENBL is cancelled. In this example, only the reference voltage Vref is clamped. If response of pre-buffer is delayed, the effect almost similar to that of FIG. 14 can therefore be attained.

Figure 17:
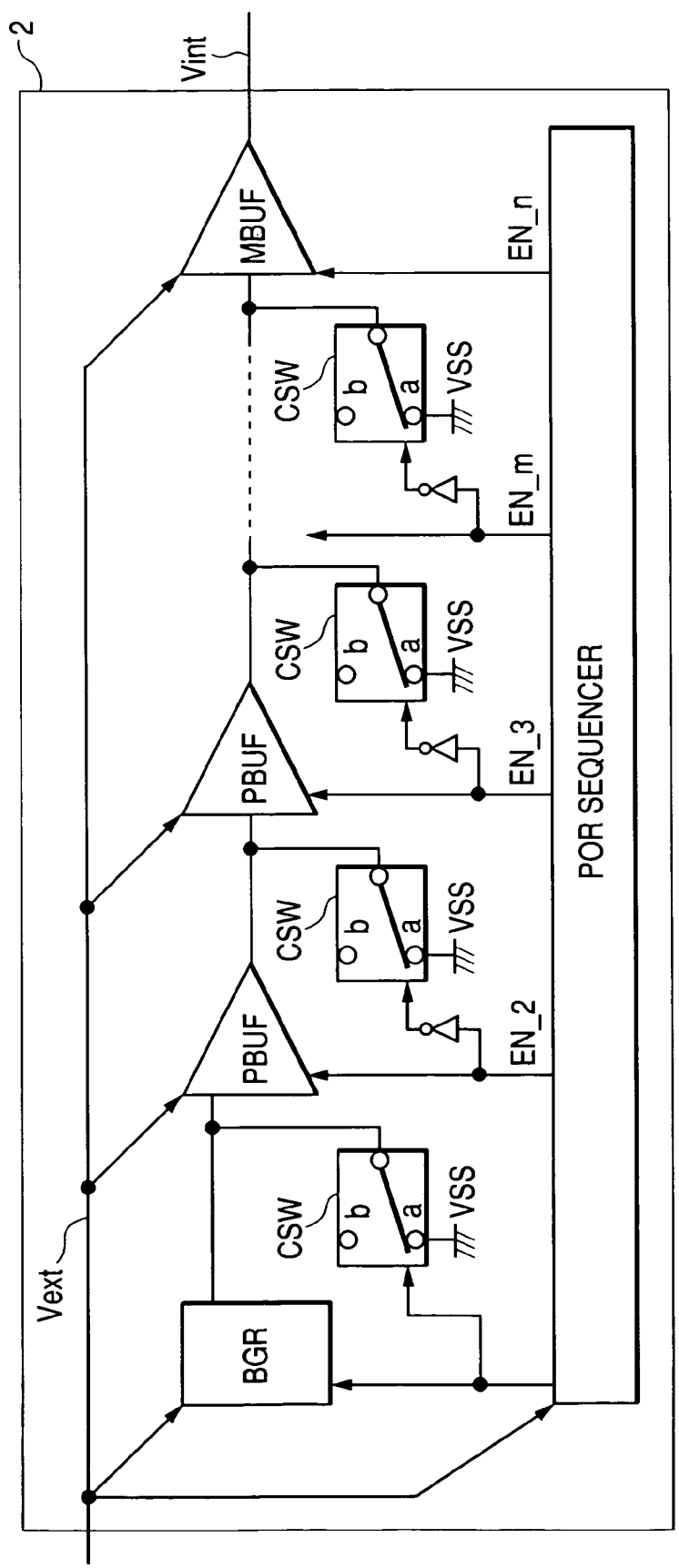
FIG. 17 is a circuit diagram illustrating another example of the internal voltage generating circuit.

FIG. 17 illustrates still another example of the internal voltage generating circuit. FIG. 17 illustrates the structure for general use obtained by modifying the structure of FIG. 1. In this case, the number of serial connections of pre-buffer (PBUF) is modified for general use in the number of stages of two or more. MBUF is the main buffer similar to the main buffer 11, PBUF is the pre-buffer similar to the pre-buffer 13, CSW is the switch for clamping, EN_0 to EN_n are enable signals of the buffer. BGR is the band gap standard voltage generating circuit similar to the standard voltage generating circuit.

Figure 18:
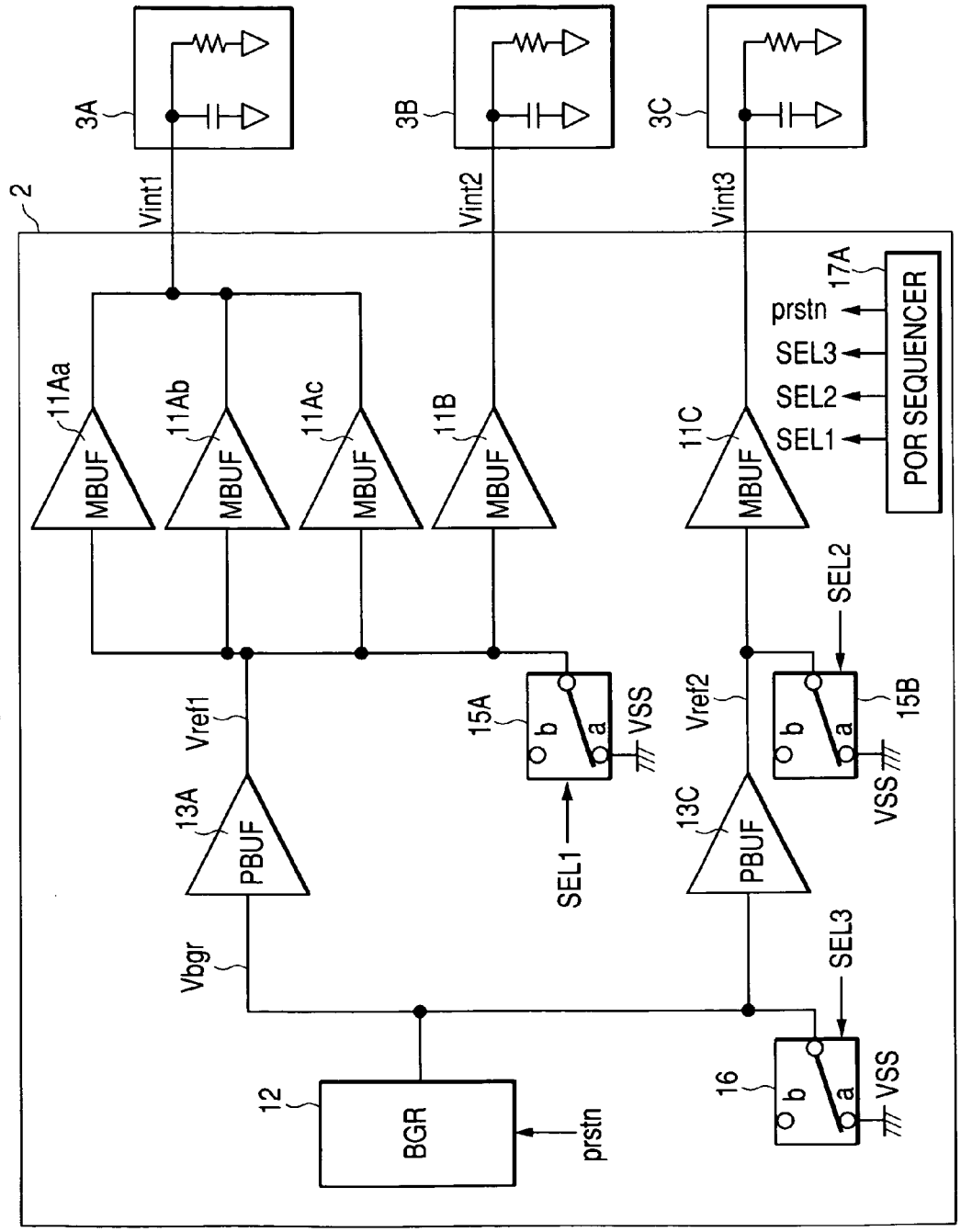
FIG. 18 is a circuit diagram illustrating another example of the internal voltage generating circuit.

FIG. 18 illustrates another example of the internal voltage generating circuit. The internal voltage generating circuit 2 generates a plurality of kinds of internal voltages Vint1, Vint2, and Vint3. If voltage drop by the wires in the chip becomes a problem, the main buffer (MBUF) is occasionally provided over the chip in the scattering method as the structure to cope with the case where the internal voltage system is divided into a plurality of systems. For example, the intrinsic internal voltages Vint1, Vint2, and Vint3 are generated for a plurality of systems such as analog system, logical circuit system, communication system, or standby control system.

Two pre-buffers 13A, 13C are provided, two first switches 15A, 15B are provided for clamping the reference voltages Vref1, Vref2 outputted from such pre-buffers toward the ground potential VSS, and five main buffers 11Aa to 11Ac, 11B, 11C are arranged. SEL1 to SEL3 are selection signals of the switches 15A to 15C to instruct the clamping with the high level thereof. BGR12 has the structure similar to FIG. 1. The selection signals SELL to SEL3 and control signal prstn are generated by the POR sequencer 17A.

Figure 19:
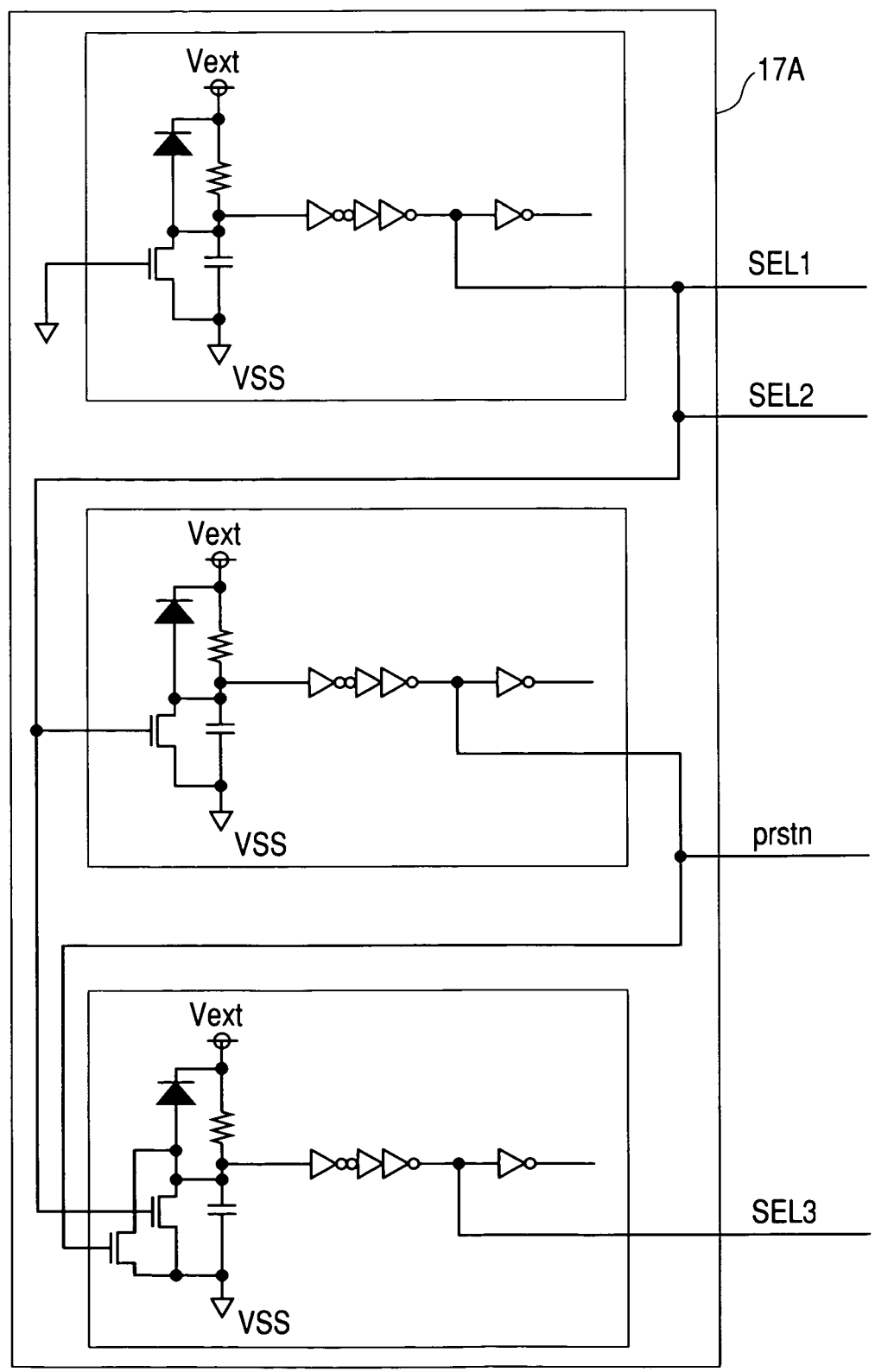
FIG. 19 is a logical circuit diagram illustrating an example of a POR sequencer.

FIG. 19 illustrates an example of the POR sequencer 17A. For the signal generation logic, the one-shot pulse generating technique utilizing the CR time constant has been adapted as is described in regard to FIG. 7. The voltage generating operation with the POR sequencer 17A will be described. When the power supply of the main buffer is inputted, outputs of the pre-buffers 13A, 13C are clamped toward the ground potential VSS by setting the switches 15A, 15B to the ground potential VSS in order to preventing overshoot in the internal voltages Vint1, Vint2, and Vint3. Immediately after the input of external voltage Vext, the control signal prstn is set to the high level and the switch 16 is also set to the ground potential VSS. Thereby, the standard voltage Vbgr is clamped toward the ground potential VSS. After the constant period has passed, the signal prstn is set, not sequentially, to the low level and the switches 15A, 15B are set to the OFF state to cancel the clamping. Thereafter, the switch 16 is turned OFF finally to cancel the clamping. Since the standard voltage side of input is clamped up to the last timing, reliability of the overshoot control operation for the internal voltages Vint1 to Vint3 at the time of drive is very high.

Figure 20:
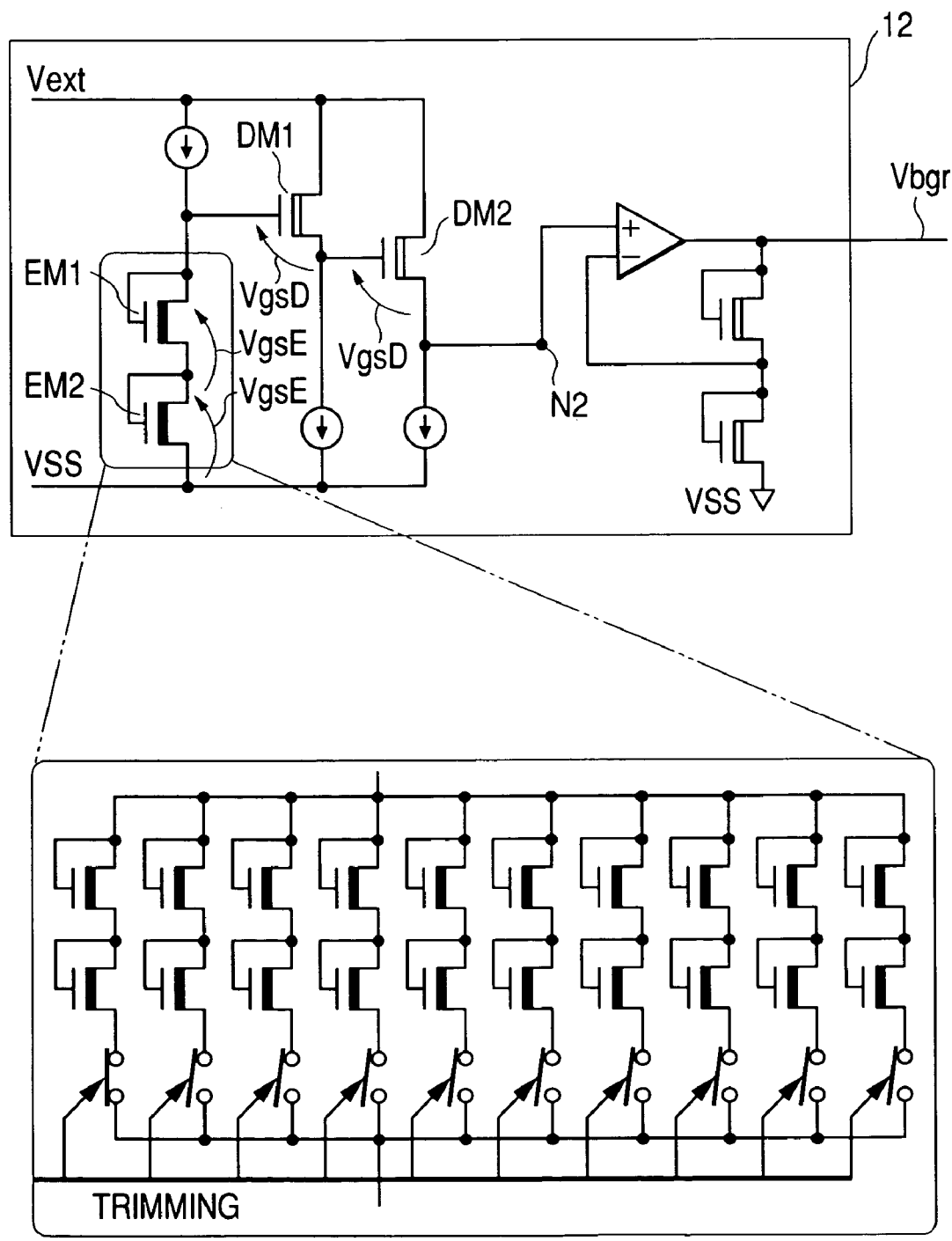
FIG. 20 is a circuit diagram illustrating another example of the standard voltage generating circuit.

FIG. 20 illustrates another example of the standard voltage generating circuit 12. The circuit illustrated in FIG. 20 generates the standard voltage Vbgr by utilizing a difference in the threshold voltages. The enhancement NMOS transistors EM1, EM2 in which the drains and sources are shorted are connected in series and the depletion NMOS transistors DM1, DM2 are connected in the source follower transistors. A voltage V(N2) of the node N2 becomes equal to V(N2) =2·(VgsE−VgsD). The standard voltage output VBGR=4· (VgsE−VgsD) can be obtained by receiving such voltage V(N2) with the amplifier of two times. A difference in Vgs of the enhancement type and depletion type is expressed as VgsE−VgsD≈VthE−VthD, namely it can be approximated with a difference in Vth of the enahancement type and depletion type, and thereby a constant voltage which is determined only by control of difference between the standard voltage output VBGR=4·(VthE−VthD) and Vth by setting the current density of EMS, EM2, DM1, DM2 to the identical value and thereby setting the operation point to the sub-threshold region or to the saturation region. In the figure, the sizes of the depletion type MOS transistors EM1, EM2 are selected actually with the trimming in accordance with fluctuation in the process, thereby to adjust the temperature characteristic and output voltage.

Figure 21:
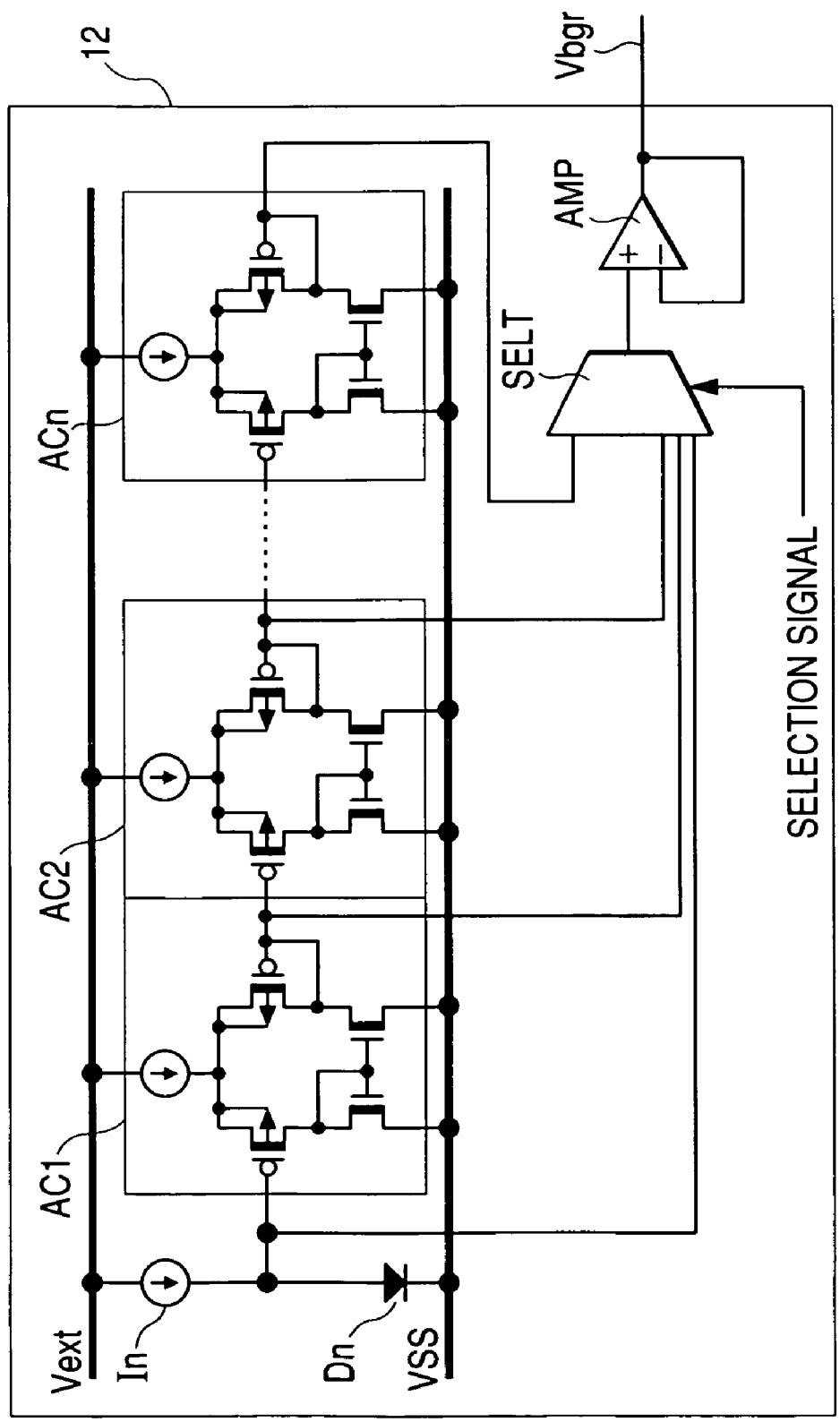
FIG. 21 is a circuit diagram illustrating another example of the standard voltage generating circuit.

FIG. 21 illustrates still another example of the standard voltage generating circuit 12. The voltage followers AC1 to ACn having the temperature characteristic in the offset and the gain of two times are connected in series to the serial node of the diode Dn and constant current source In with the input MOS size unbalanced. The node-to-cathode voltage of diode has the negative temperature characteristic, while the voltage followers AC1 to Can including the offset having temperature characteristic have positive temperature characteristic. An output of the current source circuit is selected with the selector SELT to cancel both temperature characteristics. An output of selector SELT outputted as the standard voltage Vbgr via a voltage follower amplifier AMP.

Figure 22:
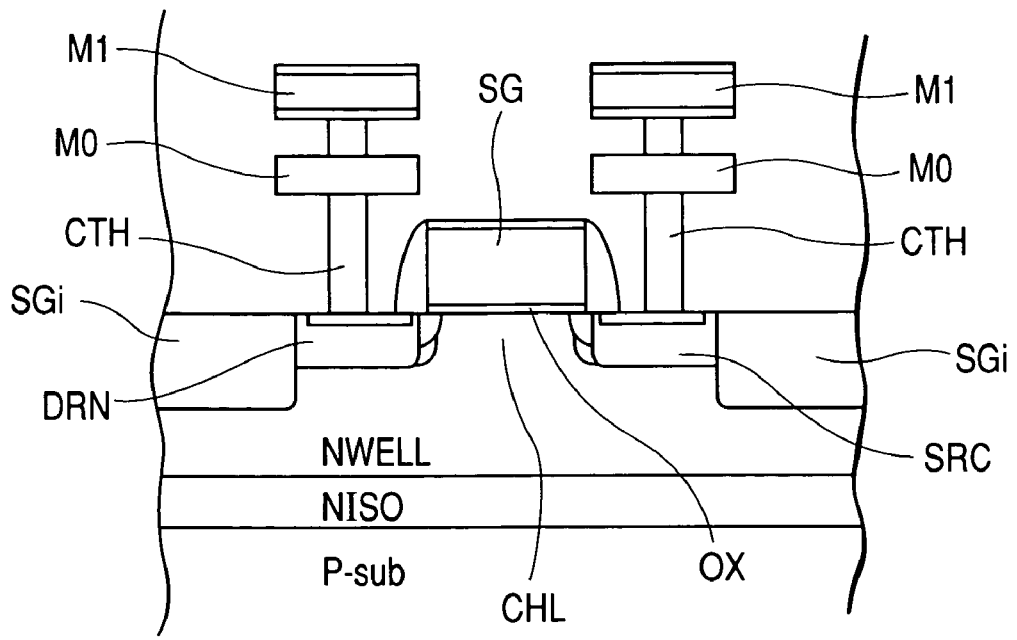
FIG. 22 is a cross-sectional view of a device structure of a p-channel low voltage MOS transistor.
Figure 23:
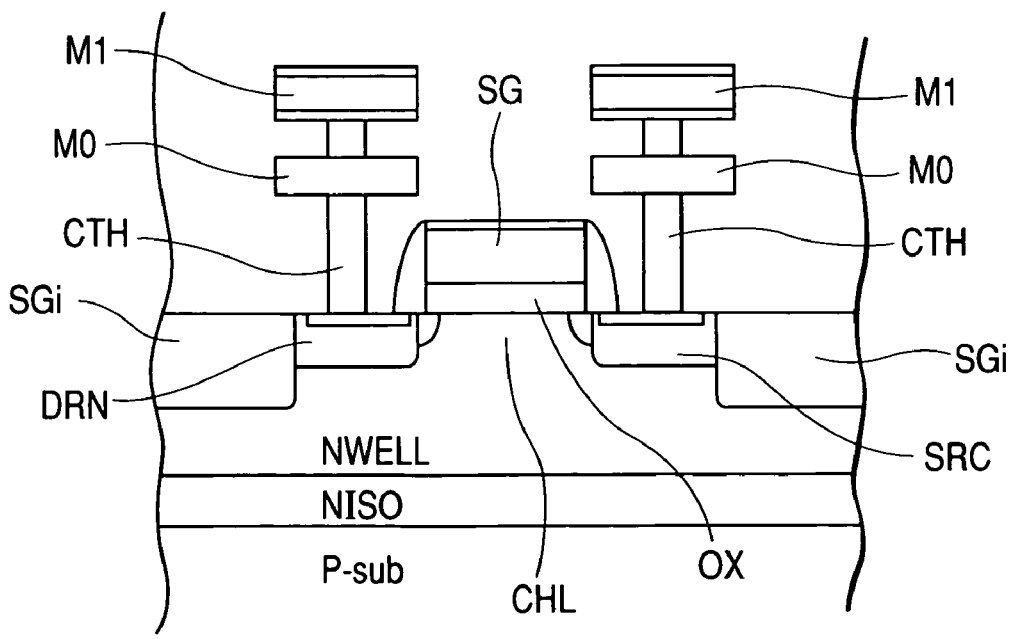
FIG. 23 is a cross-sectional view of the device structure of a p-channel high voltage MOS transistor.

FIG. 22 illustrates an example of device structure of the p-channel low voltage MOS transistor, while FIG. 23 illustrates an example of device structure of the p-channel high voltage MOS transistor. In each figure, P-sub is a p-type semiconductor substrate, NISO is an n-channel ISO (Silicon on insulating substrate) substrate, NWELL is an n-type well region, SGi is a channel stopper, SRC is ap-type source diffusing region, DRN is a p-type drain diffusing region, OX is a gate oxide film, SG is a polysilicon gate, CHL is a channel region, and M0, M1 are aluminum wires. The low voltage MOS transistor of FIG. 22 includes the gate oxide film in the thickness, for example, of 3.2 nanometers (nm). Meanwhile, the high voltage MOS transistor of FIG. 23 includes the gate oxide film in the thickness, for example, of 7.5 nm. The MOS transistor forming the internal voltage generating circuit 2 or the like is assumed as the high voltage MOS transistor, while the MOS transistor forming the internal circuit 3 is assumed as the low voltage MOS transistor. Particularly, since the gate oxide film of the high voltage MOS transistor is thick and moreover has a large minimum Lg to obtain the dielectric strength, Lg (gate length) and W (gate width) for obtaining the identical ON resistance become larger. From this point of view, the parasitic capacitance of the MOS transistor forming the internal voltage generating circuit 2 becomes large. Although not illustrated, it is enough for the n-channel MOS transistor to change the well region to the p type, while the drain region and source region to n type.

Figure 24:
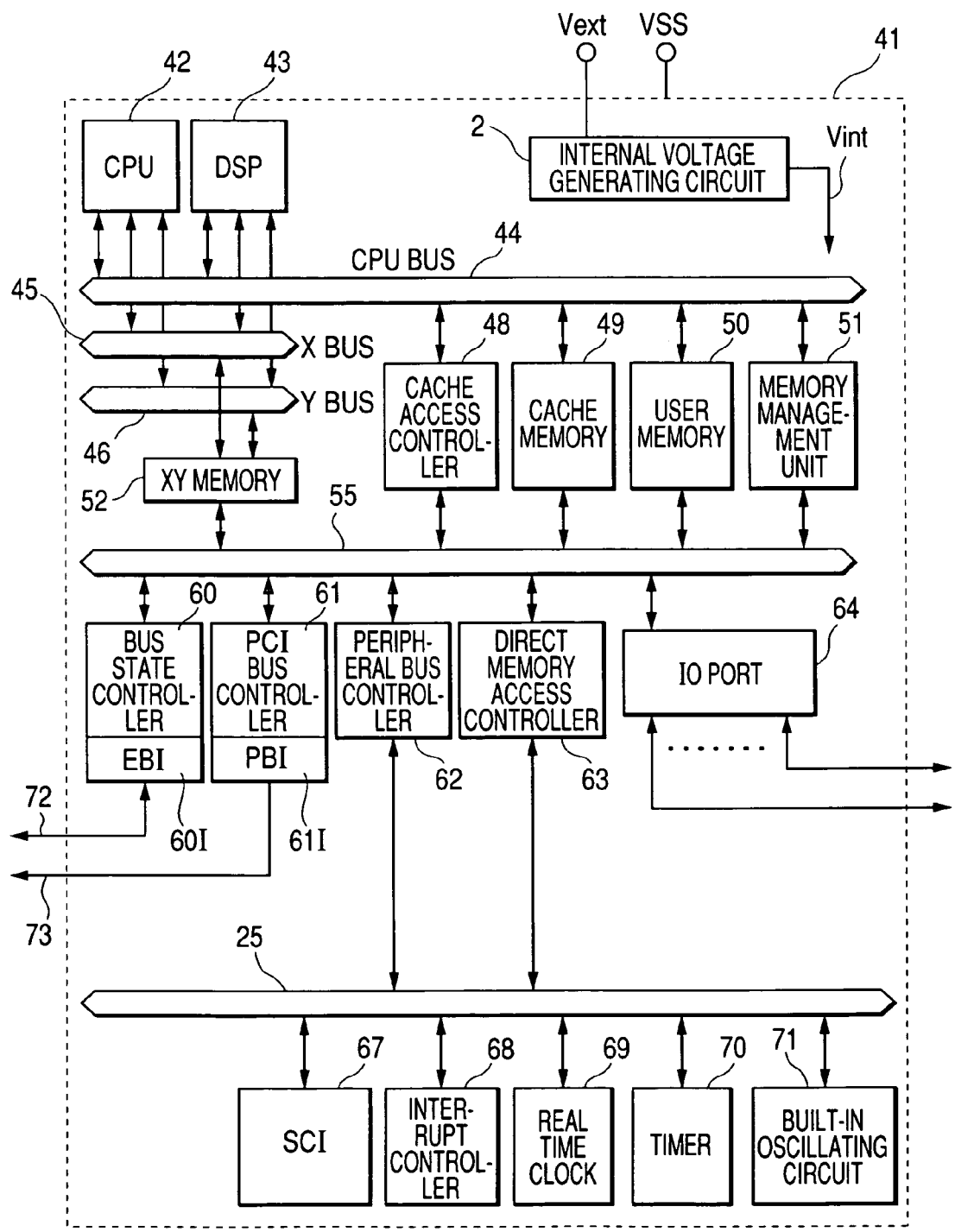
FIG. 24 is a block diagram of a microcomputer to which the present invention is adapted.

FIG. 24 illustrates a microcomputer to which the present invention is adapted. The microcomputer 41 illustrated in FIG. 24 is formed, although not particularly restricted, over only one semiconductor substrate (chip) like the single crystal silicon with the CMOS integrated circuit manufacturing technology.

The microcomputer 41 comprises a CPU (Central Processing Unit) 42 and a DSP (Digital signal Processor) 43 as a digital signal unit, which are connected to the CPU bus 44, X bus 45, and Y bus 46. The CPU bus 44 is connected with a cache access controller 48, a cache memory 49, a user memory 50 formed of SRAM, and a memory management unit 51. The X bus 45 and Y bus 46 are connected with an XY memory 52 for storing the programs or instructions and necessary calculation object data to be executed by the CPU 42 and DSP 43.

The cache access controller 48, cache memory 49, user memory 50, memory management unit 51, and XY memory 52 are connected to an internal bus 55, which is connected with a bus state controller 60 for controlling external bus access, a PCI bus controller 61, a peripheral bus controller 62, a direct memory access controller 63, and an IO port 64. The peripheral bus controller 62 controls, through the peripheral bus 65, the accesses of a serial communication interface controller (SCI) 67, an interrupt controller 68, a real time clock 69, a timer 70, and a built-in oscillation circuit 71. The PCI bus 73 connected to the PCI bus controller 61 via the PCI bus interface (PBI) 61I is connected with a large capacity memory such as a non-volatile memory such as flash memory not illustrated and a synchronous DRAM. The bus state controller 60 is connected with an external bus 74 via an external bus interface (EBI) 60I.

The microcomputer 41 includes the internal voltage generating circuit 2. The external voltage Vext is supplied to the external bus interface 60I, PCI bus interface 61I, IO port 64, and internal voltage generating circuit 2. The other modules are operated with the internal voltage Vint as the operation power supply.

Figure 25:
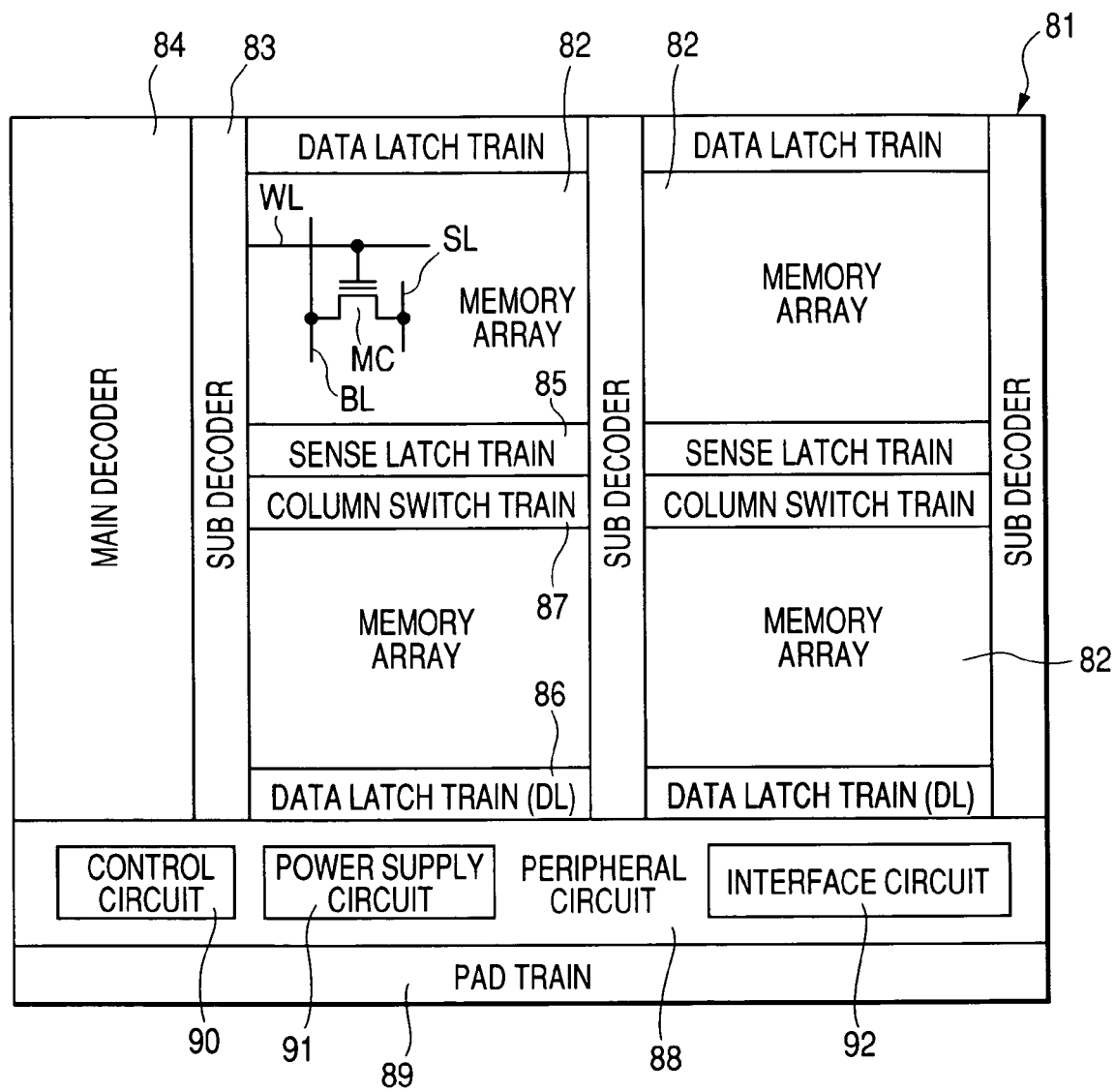
FIG. 25 is a block diagram of a flash memory to which the present invention is adapted.

FIG. 25 illustrates a flash memory to which the present invention is adapted. The flash memory 81 illustrated in FIG. 25 is formed, although not particularly restricted, over one semiconductor substrate such as single crystal silicon and includes a memory array 82, a subdecoder 83, a main decoder 84, a sense latch train 85, a data latch train 86, a column switch train 87, a peripheral circuit 88, and a pad train 89. The peripheral circuit 88 includes a power supply circuit 91, a control circuit 90, and an interface circuit 92.

The memory array 82 includes many non-volatile memory cells MCs which are reversively varied in the threshold values through electrical erase and write operations. In this specification, erase operation means drop of threshold voltage of the non-volatile memory cell MC, while the write operation means rise of threshold voltage of the non-volatile memory cell. The non-volatile memory cell MC has a stacked gate structure, for example, in which the insulated floating gate and control gate are arranged over a channel region provided between the source and drain. The control gate of the non-volatile memory cell MC is connected to the word line WL, while the drain to the bit line BL and the source to the source line SL. Word line selection and bit line selection by the column switch train 87 are performed on the basis of decode signal supplied from the main decoder 84 and subdecoder 83 for decoding the address signal. The bit line BL is connected, at one end thereof, with a sense latch of the sense latch train 85, while with a data latch of the data latch train 86 at the other end thereof. The data read from the non-volatile memory cell by the word line selection of read operation is detected using the data latch of data latch train 86 and sense latch of sense latch train 85 and is transferred to the interface circuit 92 in accordance with the access unit such as byte or word selected by the column switch train 7. Erase operation is performed, although not particularly restricted, in unit of word line. In the write operation, the write data inputted to the interface circuit 92 is latched by the sense latch train 85 via the column switch train 87 and application and rejection of write voltage are controlled in accordance with the logical value of the data latched by the sense latch train 85.

The power supply circuit 91 generates operation power supplies such as high voltage required for erase and write operations of the flash memory 81 and word line step-up voltage required for read operation thereof using a charge-pump circuit and series regulator or the like. As the series regulator, the internal voltage generating circuit 2 is adapted. The control circuit 90 performs the timing control and selection control of operation power supplies of erase, write, and read operations of the flash memory 81 in accordance with the strobe signal and command inputted from the external circuit. The pad train 9 includes the externally connected bonding pad and input/output buffer.

The preferred embodiment of the present invention has been described practically but the present invention is not limited to such embodiment and may be changed and modified within the scope not departing from the subject matter thereof.

For example, the present invention is not limited to the embodiment using a series regulator and allows use of a shunt regulator, switching regulator, and a switched capacitor regulator. That is, the internal node of the control circuit can be clamped with a switch in the direction for turning OFF the output MOS transistor when the power supply is inputted, the standard voltage can be shifted to the safety side (for example, Vss) when the external power supply is inputted only by replacing the output transistor of series regulator, in the case of the switching regulator, into the switch control circuit, switch for processing the electrical power (transistor) and switching circuit using inductor, capacitor, diode, and capacitor and by replacing, in the case of switch and capacitor regulator, into the switch control circuit, switch (transistor), and capacitor. Otherwise, generation of overshoot in the transitional risky side (for example, the voltage higher than the operation voltage) can be controlled by fixing the initial value to the safety side and giving limitation on the through-rate when the circuit is driven. Moreover, influence of overshoot is considerably large at the point where the clamping by the switch is executed and sufficient measure can be made at the small number of areas by paying attention to the part in which longer time constant is required for recovery. In addition, even when a plurality of main buffers are provided as illustrated in FIG. 18, for example, it is also possible to compensate for the characteristics by positively using each buffer (for example, combination of 11Aa and 11Ab and combination of 11Aa and 11B) as different circuits.

What is claimed is:

1. A semiconductor integrated circuit comprising:
   an internal voltage generating circuit; and
   an internal circuit which operates by receiving supply of operation power supply voltage from said internal voltage generating circuit,
   wherein the internal voltage generating circuit includes a voltage generating circuit for generating a second voltage from a first voltage supplied from outside of the semiconductor integrated circuit, and an output buffer for generating a third voltage corresponding to said second voltage, wherein said third voltage is supplied as the operation power supply voltage of said internal circuit, and wherein the semiconductor integrated circuit further comprises a first switch for enabling an output node of said second voltage to become conductive to a predetermined potential, and a control circuit for turning ON said first switch for a predetermined period in response to input of said first voltage.

2. The semiconductor integrated circuit according to claim 1, wherein said voltage generating circuit includes a standard voltage generating circuit for generating the standard voltage from said first voltage, and a pre-buffer for generating the second voltage by receiving said standard voltage.

3. The semiconductor integrated circuit according to claim 2, further comprising:

a second switch for enabling an output node of said standard voltage to become conductive to the predetermined potential, wherein said control circuit controls said second switch to be switched for enabling to become conductive to the predetermined potential for the predetermined period in response to input of said first voltage.

4. The semiconductor integrated circuit according to claim 2, further comprising:

a third switch for enabling a bias voltage supply path of a current source for applying an operation current to said pre-buffer to become conductive to the predetermined potential, wherein said control circuit controls said third switch to ON state for the predetermined period in response to input of said first voltage.

5. The semiconductor integrated circuit according to claim 1, wherein said control circuit controls said output buffer to a low output impedance state from a high output impedance state after said predetermined period has passed.

6. The semiconductor integrated circuit according to claim 1, wherein a MOS transistor forming said internal voltage generating circuit is a high voltage MOS transistor, and wherein a MOS transistor forming said internal circuit is a low voltage MOS transistor.

7. The semiconductor integrated circuit according to claim 1, wherein a MOS transistor forming said internal voltage generating circuit includes a gate oxide film having a first thickness, and wherein a MOS transistor forming said internal circuit includes a gate oxide film having a second thickness which is smaller than said first thickness.

8. The semiconductor integrated circuit according to claim 1, wherein said control circuit is a power-on reset circuit for instructing power-on reset in response to input of said first voltage.

9. The semiconductor integrated circuit according to claim 8, wherein said predetermined period is shorter than the reset period.

10. The semiconductor integrated circuit according to claim 1, wherein said internal circuit includes a central processing unit and a memory.

11. The semiconductor integrated circuit according to claim 1, wherein said internal circuit includes a plurality of non-volatile memory cells which are connected to the word lines through the selection terminal thereof and to the bit lines through the data terminal thereof, and an address decoder for selecting memory cells by decoding the address signal.

12. A semiconductor integrated circuit comprising:

an internal voltage generating circuit; and an internal circuit which operates by receiving operation voltage supplies from said internal voltage generating circuit, wherein said internal voltage generating circuit includes a first voltage generating circuit for generating a second voltage from a first voltage supplied from outside of the semiconductor integrated circuit, and an output buffer for generating a third voltage corresponding to said second voltage, wherein said third voltage is supplied to said internal circuit as the operation voltage, wherein said first voltage generating circuit includes a standard voltage generating circuit for generating the standard voltage from said first voltage, and a pre-buffer for generating said second voltage by receiving said standard voltage, and wherein the semiconductor integrated circuit further comprises a first switch for making conductive an output node of said standard voltage to a predetermined potential, and a control circuit for turning ON said first switch for a predetermined period in response to input of said first voltage.

* * * * *